(12) United States Patent
Kutsukake et al.

(10) Patent No.: US 8,319,316 B2
(45) Date of Patent: Nov. 27, 2012

(54) DEPLETION MOS TRANSISTOR AND ENHANCEMENT MOS TRANSISTOR

(75) Inventors: Hiroyuki Kutsukake, Yokohama (JP);
Kenji Gomikawa, Yokohama (JP);
Yoshiko Kato, Yokohama (JP);
Mitsuhiro Noguchi, Yokohama (JP);
Masato Endo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 12/788,784

(22) Filed: May 27, 2010

(65) Prior Publication Data

US 2010/0301426 A1    Dec. 2, 2010

(30) Foreign Application Priority Data

May 29, 2009   (JP) .................................. 2009-131327
Feb. 12, 2010   (JP) .................................. 2010-029218

(51) Int. Cl.
*H01L 21/02* (2006.01)
(52) U.S. Cl. ................. 257/611; 257/406; 257/E29.269
(58) Field of Classification Search .................. 257/391, 257/402, 403, 607, 611, E29.269, E21.619
See application file for complete search history.

(56) References Cited

U.S. PATENT DOCUMENTS

| 5,952,701 A * | 9/1999 | Bulucea et al. ............... 257/407 |
|---|---|---|
| 7,274,603 B2 | 9/2007 | Futatsuyama et al. |
| 7,528,442 B2 * | 5/2009 | Fukumoto et al. ............ 257/336 |
| 7,595,243 B1 * | 9/2009 | Bulucea et al. ................ 438/276 |
| 8,067,801 B2 * | 11/2011 | Matsudai et al. .............. 257/336 |
| 8,093,664 B2 * | 1/2012 | Gomikawa et al. ............ 257/403 |
| 2002/0185676 A1 * | 12/2002 | Momose ........................ 257/327 |
| 2004/0104429 A1 * | 6/2004 | Takahashi et al. ............. 257/338 |
| 2004/0201063 A1 * | 10/2004 | Fukuda .......................... 257/347 |
| 2005/0093033 A1 * | 5/2005 | Kinoshita et al. .............. 257/288 |
| 2005/0269646 A1 * | 12/2005 | Yamada ......................... 257/390 |
| 2008/0237740 A1 * | 10/2008 | Chen et al. ..................... 257/391 |
| 2009/0218637 A1 * | 9/2009 | Gomikawa et al. ........... 257/402 |

FOREIGN PATENT DOCUMENTS

| JP | 2002-299475 | 10/2002 |
|---|---|---|
| JP | 2006-196061 | 7/2006 |

* cited by examiner

*Primary Examiner* — Matthew Landau
*Assistant Examiner* — Joseph C Nicely
(74) *Attorney, Agent, or Firm* — Oblon, Spivak, McClelland, Maier & Neustadt, L.L.P.

(57) ABSTRACT

A semiconductor memory device includes a first transistor. The first transistor includes a gate electrode, a channel region, a source region, a source region, an overlapping region, a contact region, and an impurity diffusion region. The channel region has a first impurity concentration. The source and drain regions have a second impurity concentration. The overlapping region is formed in the semiconductor layer where the channel region overlaps the source region and the drain region, and has a third impurity concentration. The contact region has a fourth impurity concentration. The impurity diffusion region has a fifth impurity concentration higher than the second impurity concentration and lower than the fourth impurity concentration. The impurity diffusion region is in contact with the contact region and away from the overlapping region and positioned at least in a region between the contact region and the overlapping region.

14 Claims, 29 Drawing Sheets

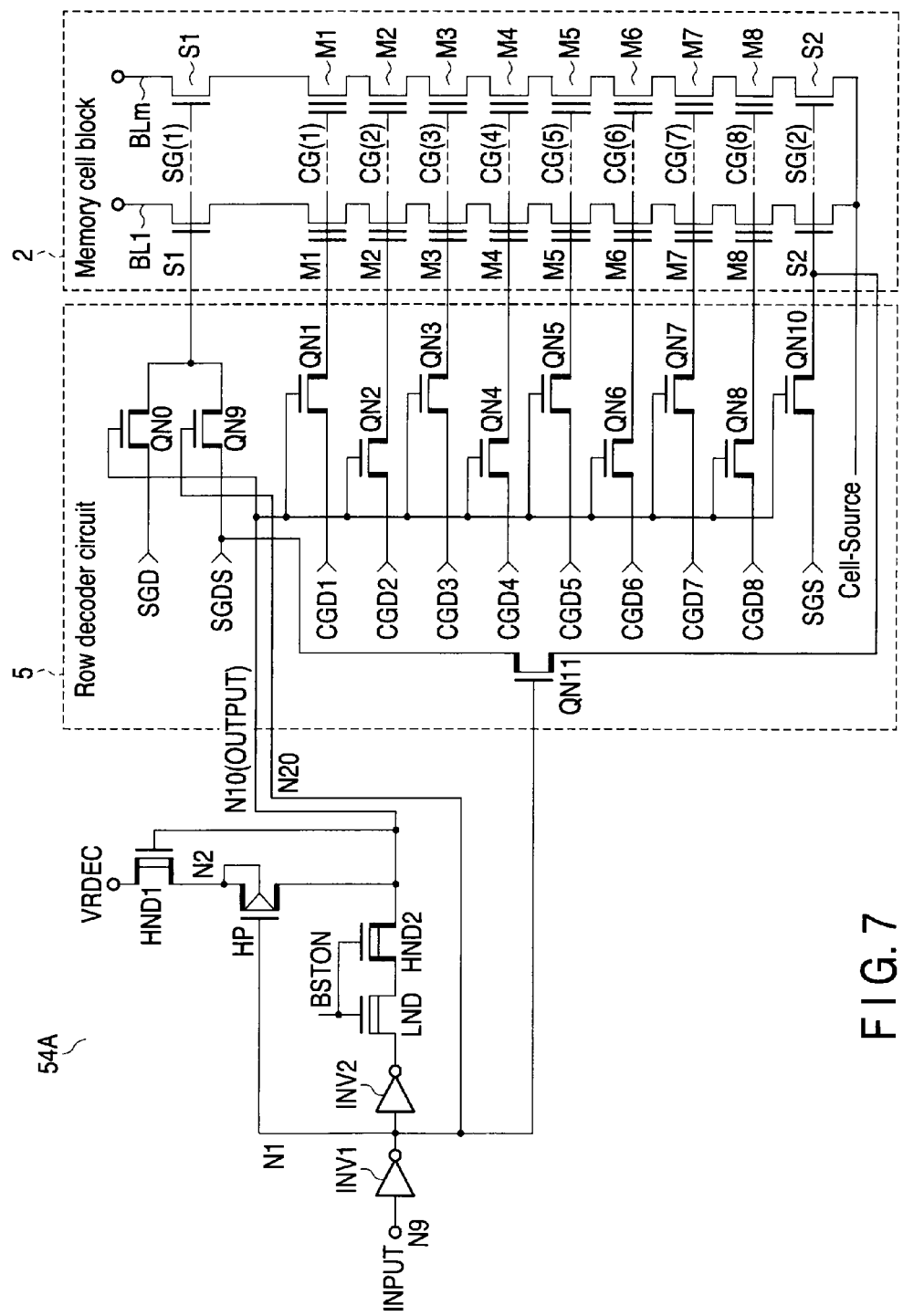
F I G. 7

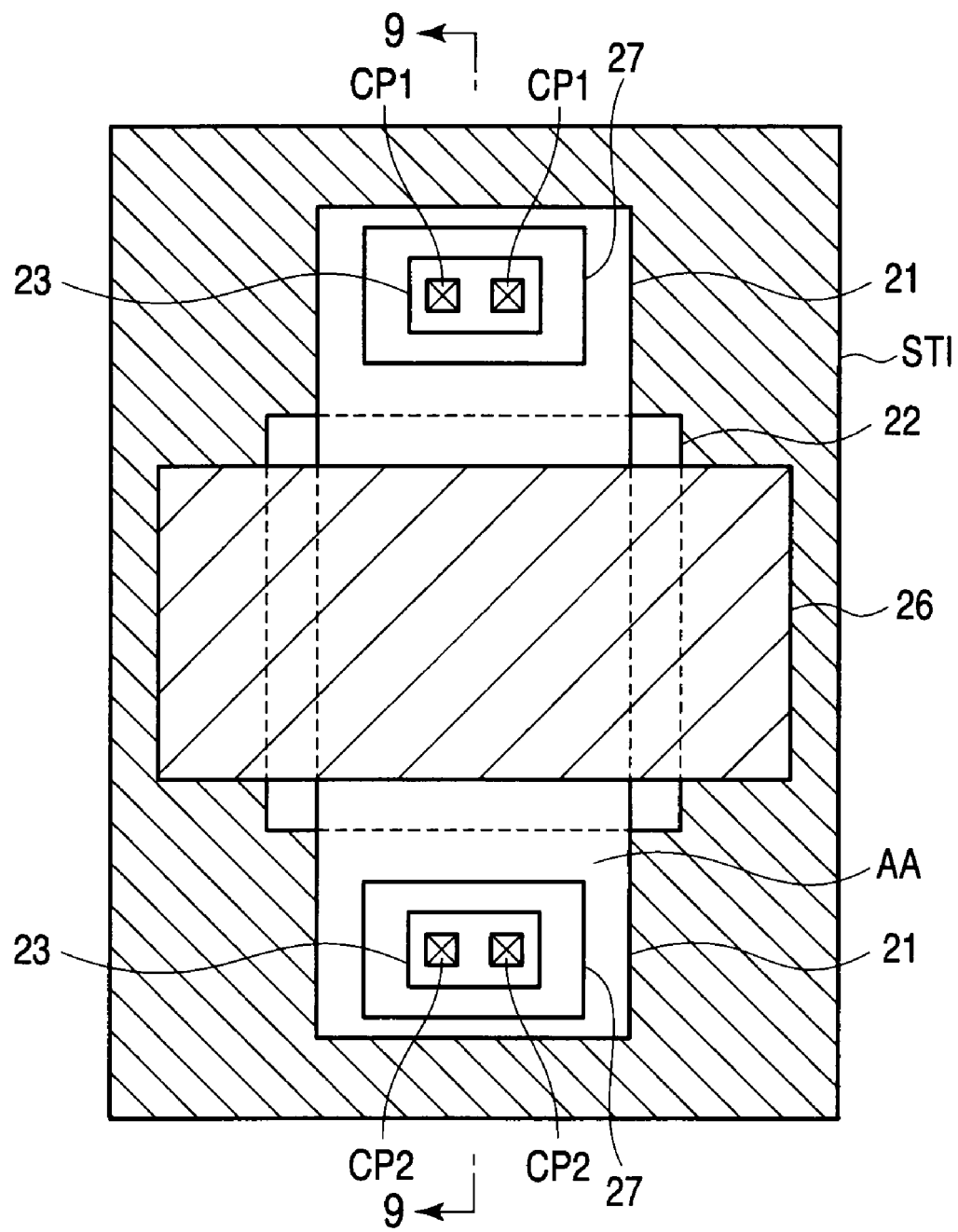
F I G. 8

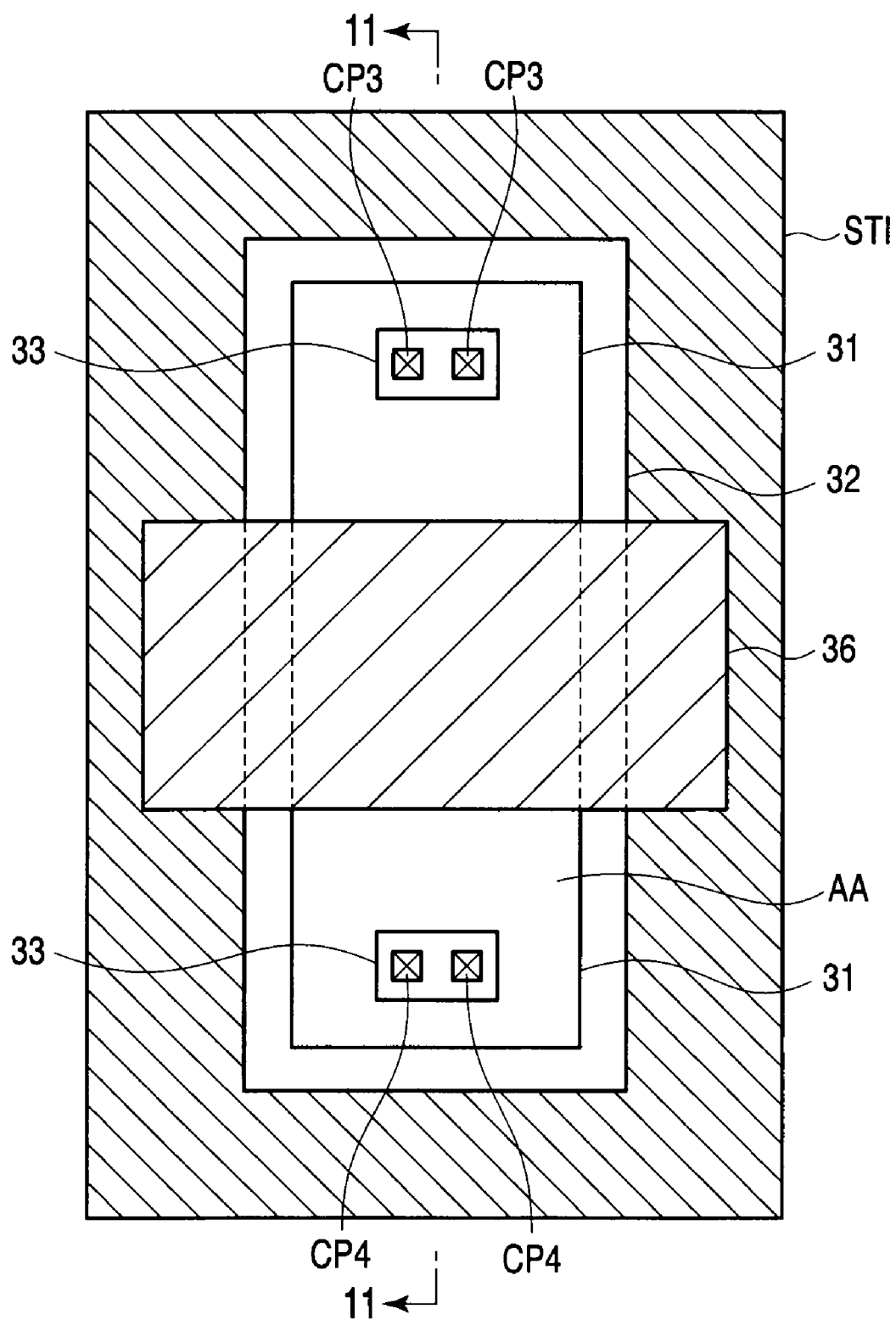
F I G. 10

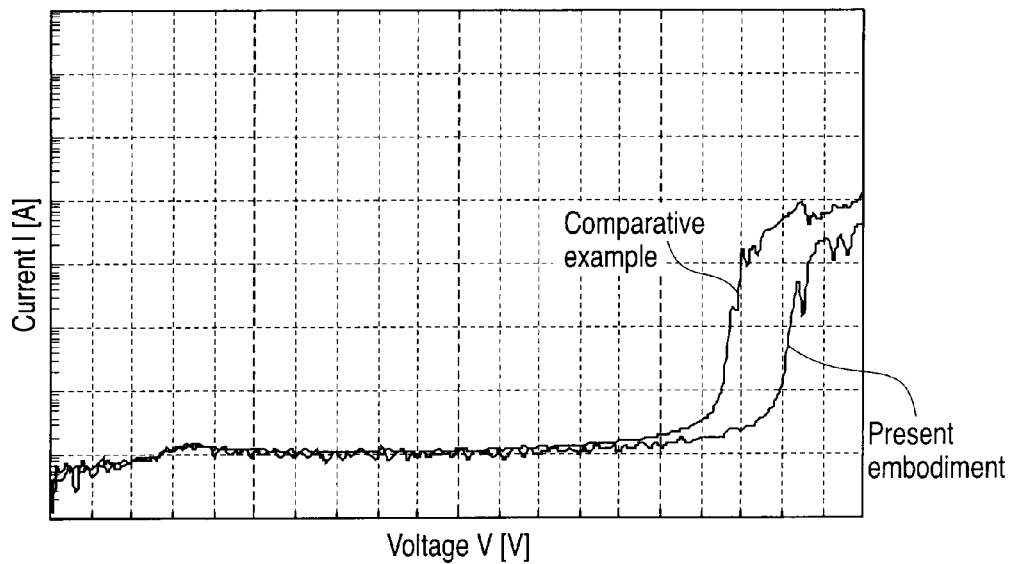
F I G. 21
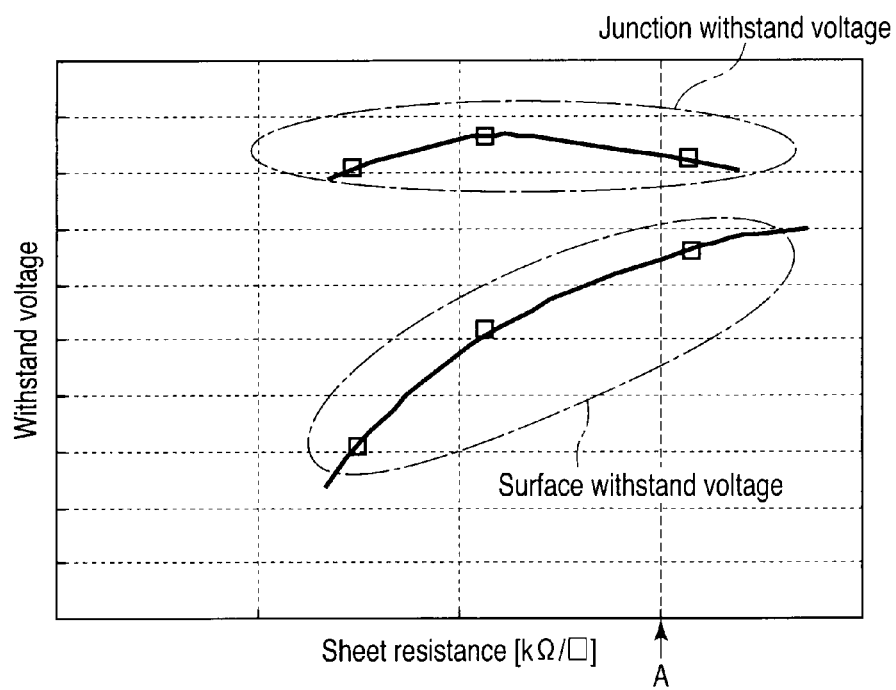
F I G. 22

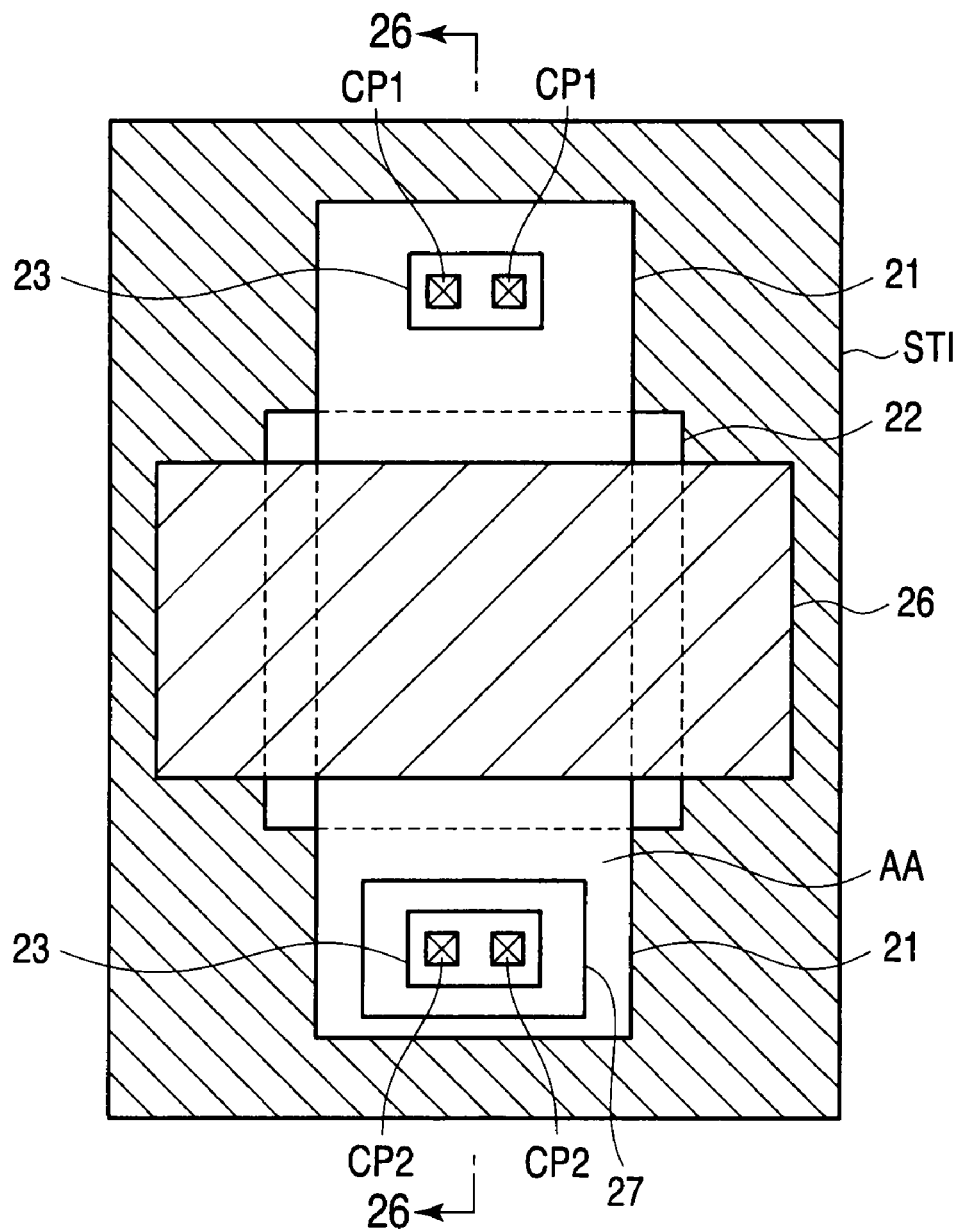
F I G. 25

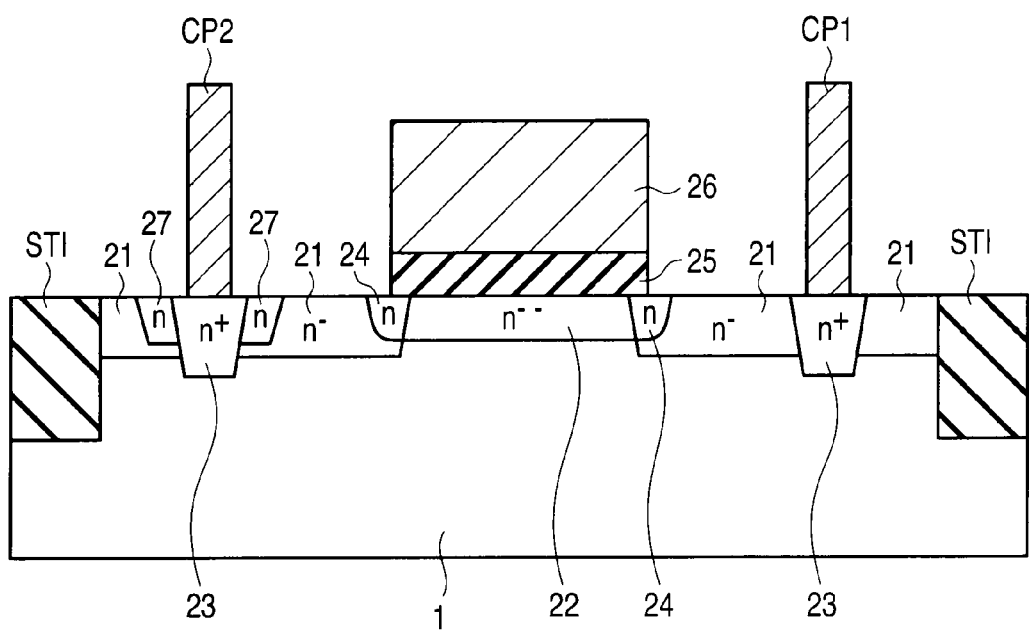
F I G. 26

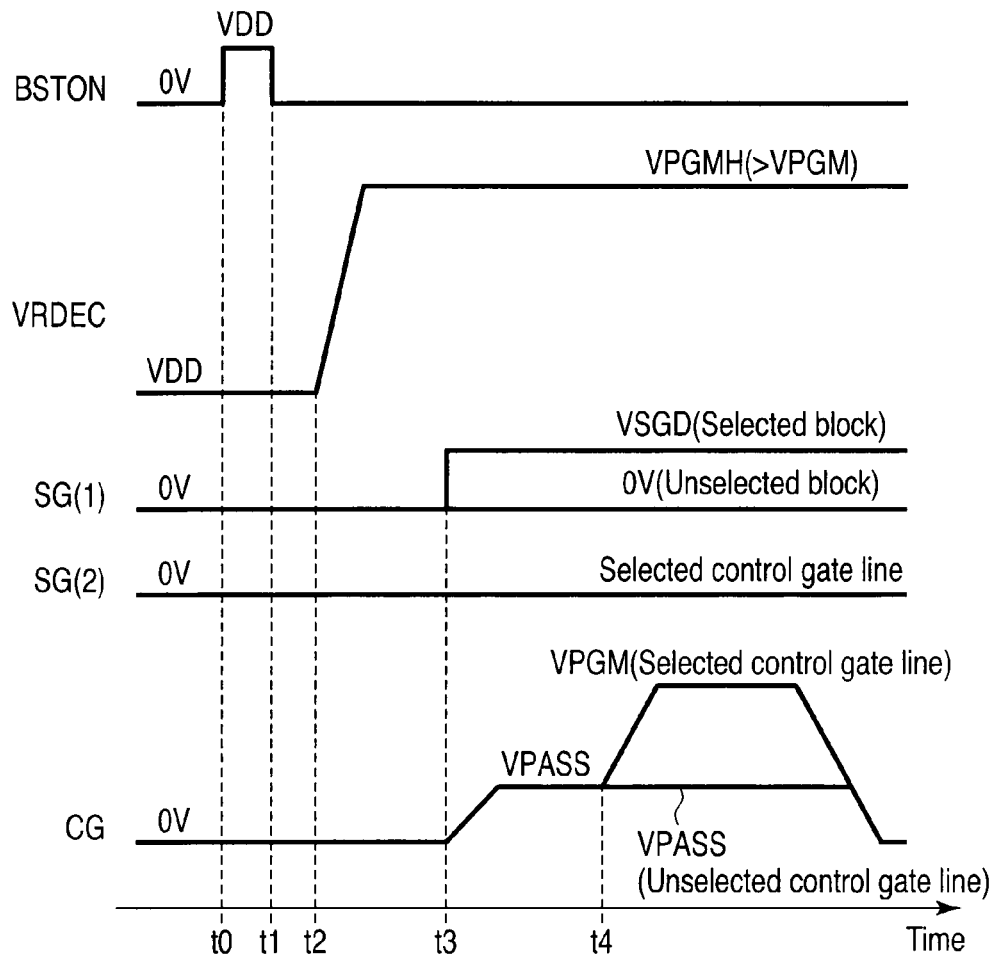
F I G. 27A

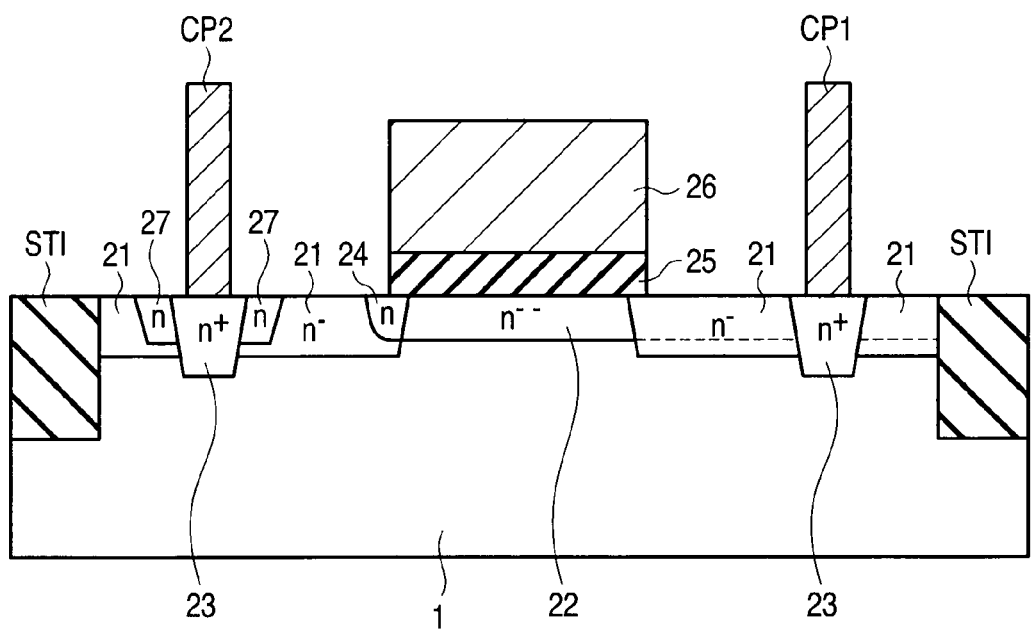
F I G. 27C

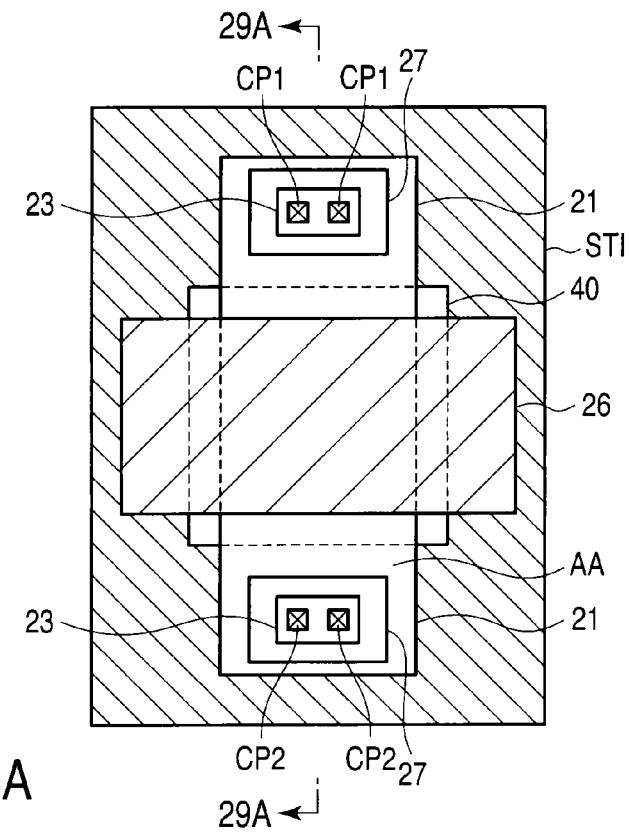
F I G. 2 8A
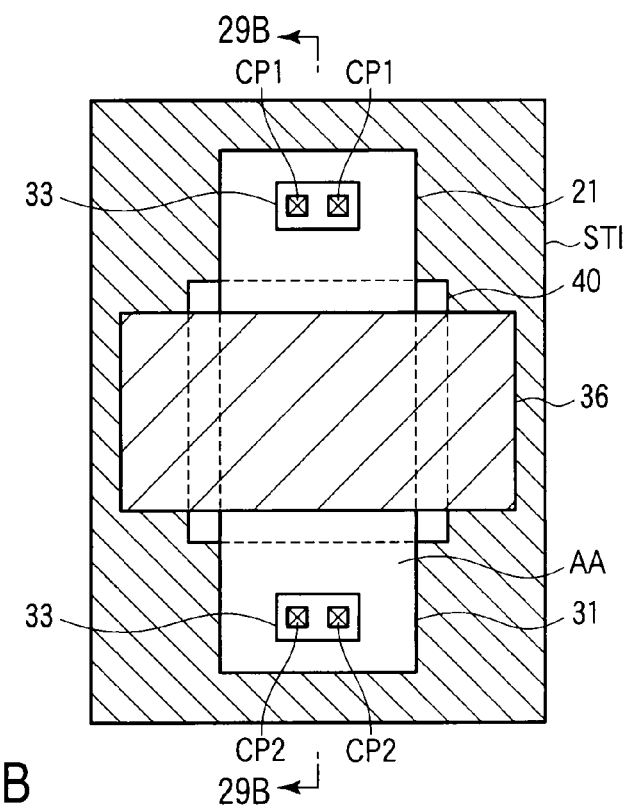
F I G. 2 8B

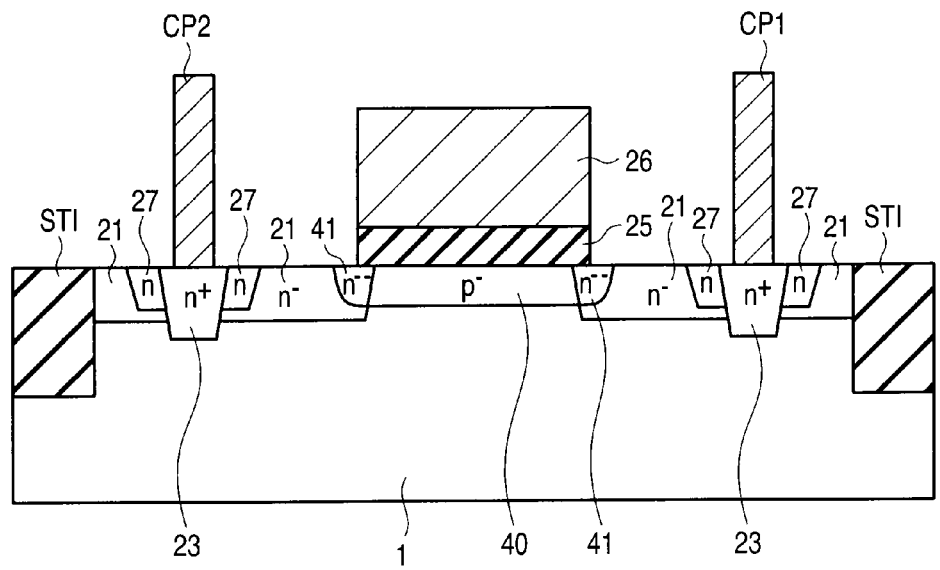
F I G. 2 9 A
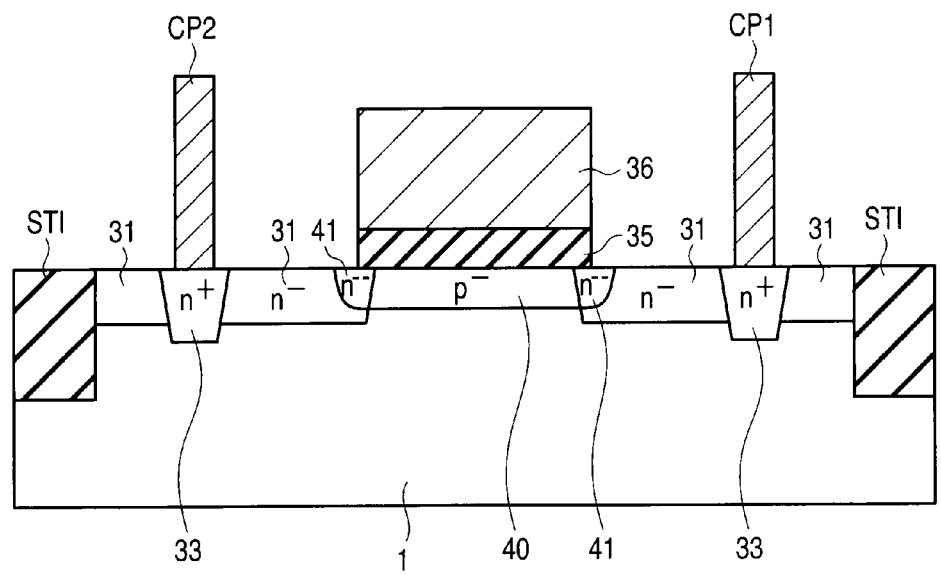
F I G. 2 9 B

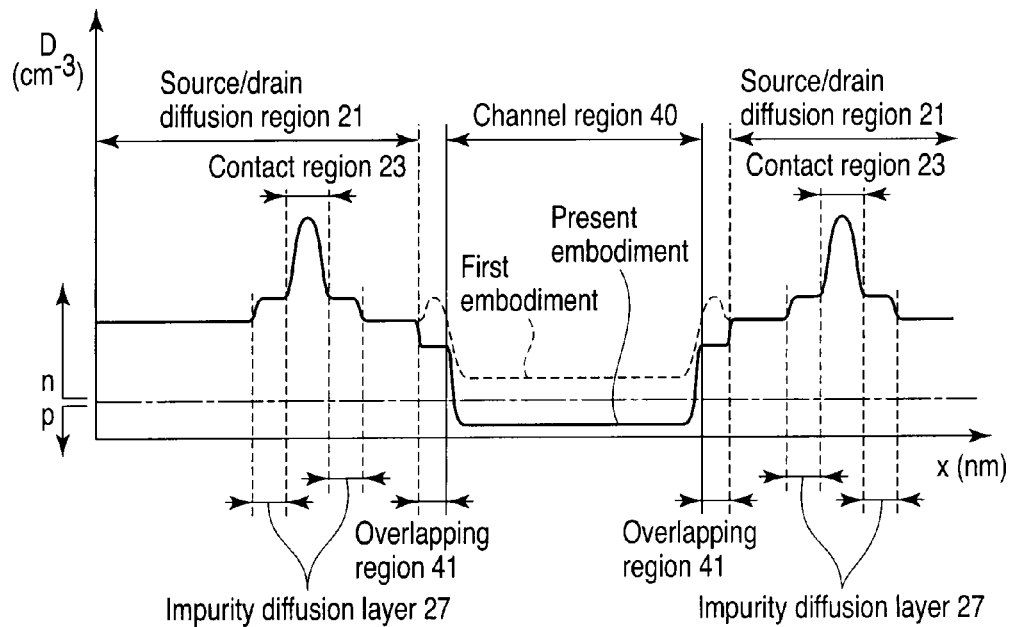
F I G. 3 0A
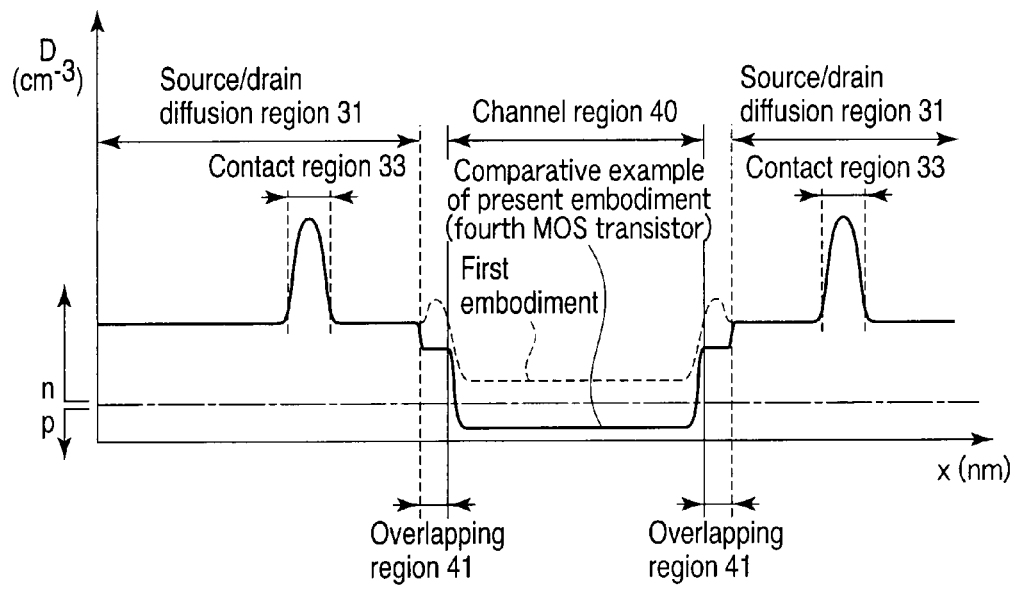
F I G. 3 0B

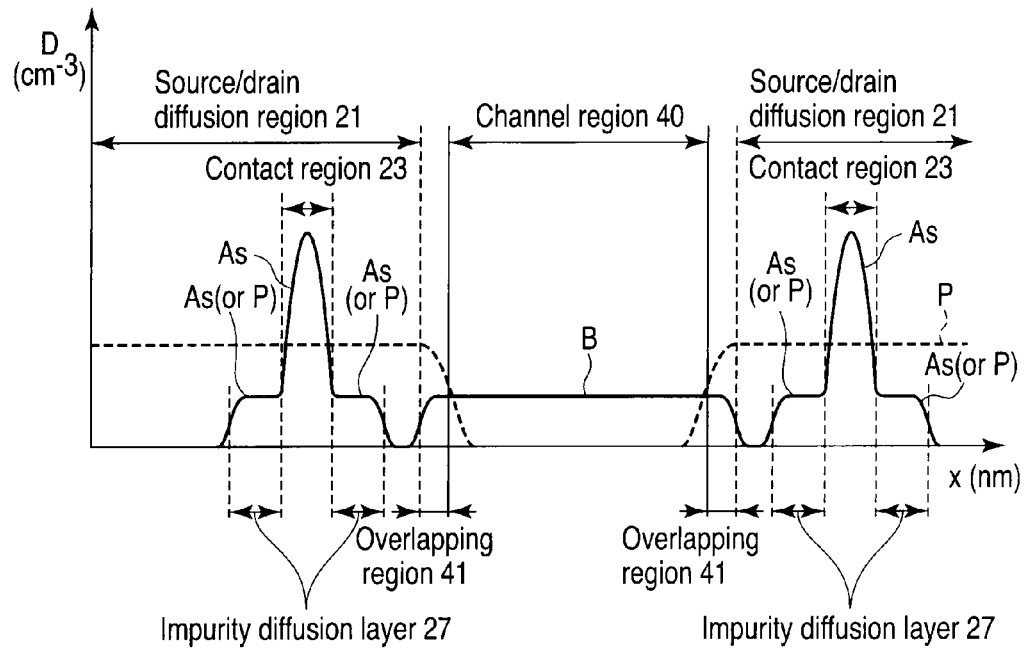
F I G. 3 1A
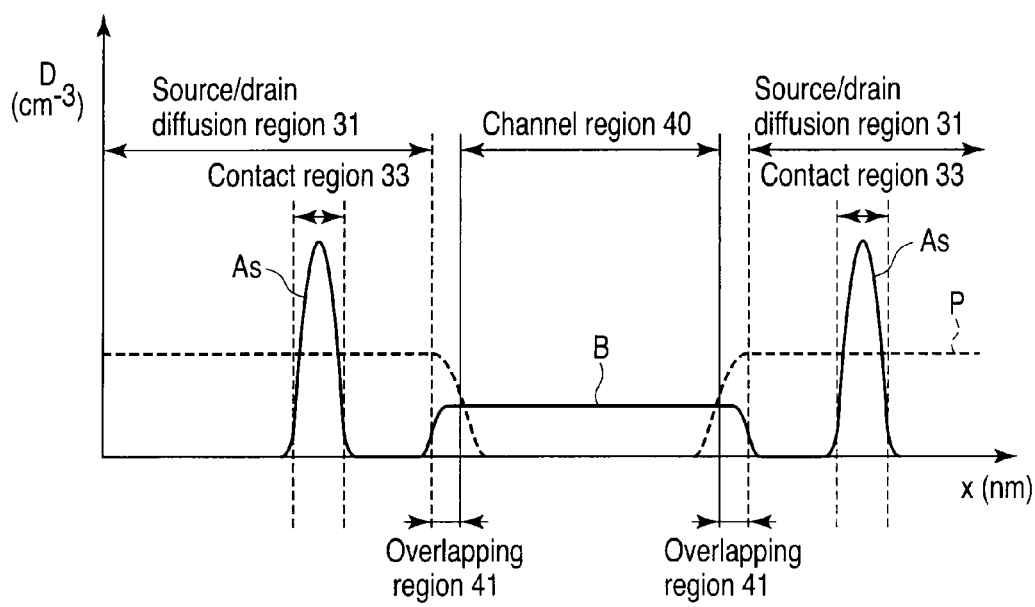
F I G. 3 1B

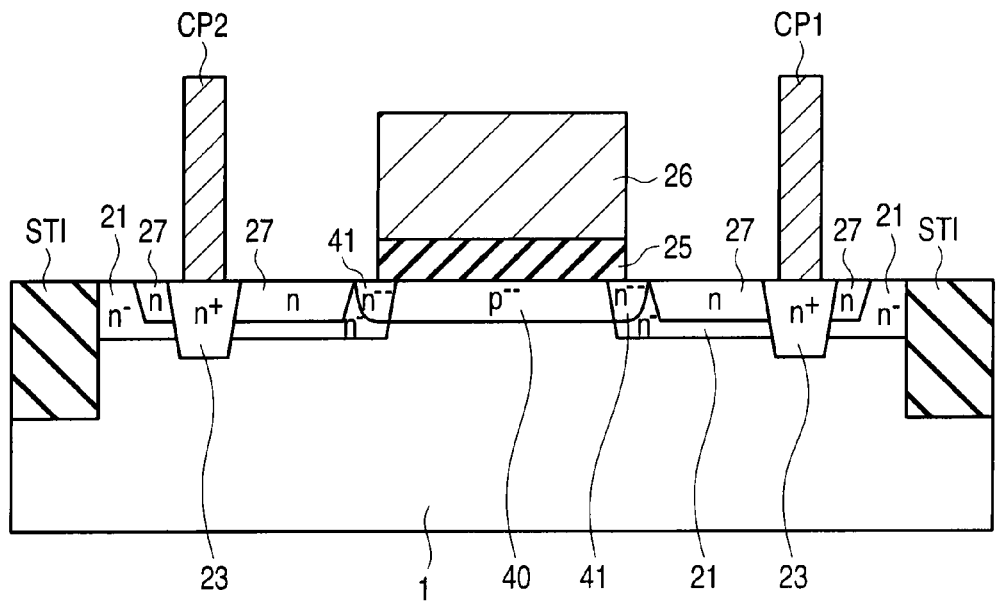
F I G. 3 8
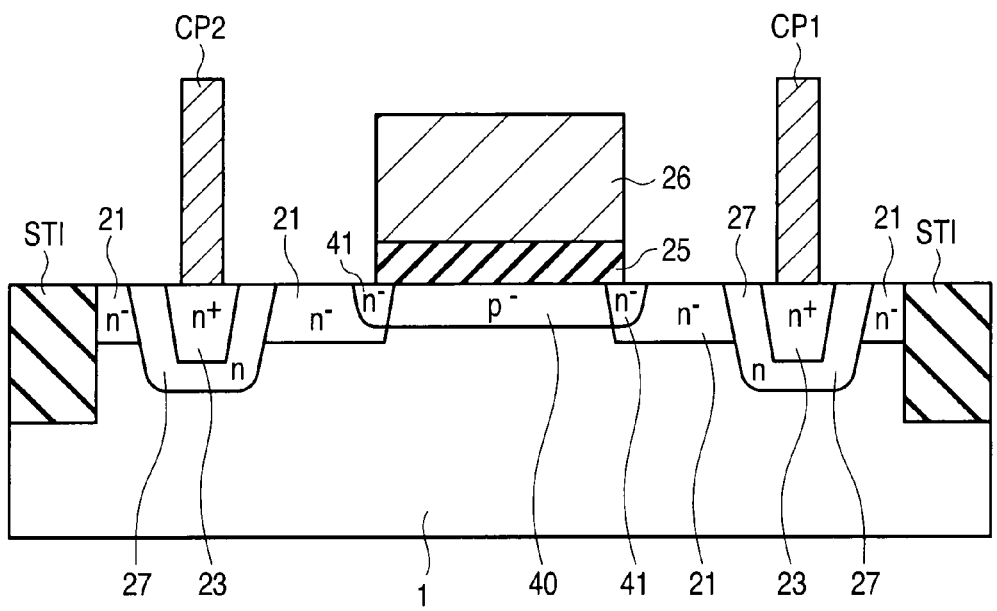
F I G. 3 9

DEPLETION MOS TRANSISTOR AND ENHANCEMENT MOS TRANSISTOR

CROSS-REFERENCE TO RELATED APPLICATIONS

This application is based upon and claims the benefit of priority from prior Japanese Patent Applications No. 2009-131327, filed May 29, 2009; and No. 2010-029218, filed Feb. 12, 2010, the entire contents of both of which are incorporated herein by reference.

BACKGROUND OF THE INVENTION

1. Field of the Invention

The present invention relates to a depletion MOS transistor and an enhancement MOS transistor.

2. Description of the Related Art

Conventionally known semiconductor memory devices include an electrically programmable nonvolatile type. In particular, NAND flash memories in which a plurality of memory cells are connected together in series to form a NAND cell are commonly used because these memories can be highly integrated.

Each memory cell in a NAND flash memory has a MOSFET structure in which a floating gate (charge accumulation layer) and a control gate are stacked on a semiconductor substrate with an insulating film interposed therebetween. A plurality of memory cells are connected together in series such that the adjacent memory cells share the source or drain. The memory cells thus form a NAND cell connected to a bit line as one unit. Such NAND cells are arranged in a matrix so as to form a memory cell array. Memory cell arrays are integrally formed on a p-type semiconductor substrate or in a p-type well region.

In the NAND flash memory, a voltage higher than a power supply voltage needs to be transferred to a control gate line in a selected block. To transfer such a high voltage to memory cells, the conventional NAND flash memory includes a row decoder circuit with a voltage conversion circuit configured to convert the power supply voltage into a high voltage. Such a configuration is disclosed in, for example, Jpn. Pat. Appln. KOKAI Publication No. 2006-196061. Such a row decoder generally includes plural types of MOS transistors such as a high breakdown-voltage enhancement-type (E-type) n-channel MOS transistor, a high breakdown-voltage depletion-type (D-type) re-channel MOS transistor, and a high breakdown-voltage E-type p-channel MOS transistor.

Thus, it is important that these high breakdown-voltage MOS transistors offer sufficient breakdown-voltages.

BRIEF SUMMARY OF THE INVENTION

A semiconductor memory device according to an aspect of the present invention includes:

a memory cell array including a memory cell transistor with a charge layer formed on a semiconductor substrate with a gate insulating film interposed therebetween; and a peripheral circuit including at least a first transistor, wherein the first transistor includes:

a first gate electrode disposed in a surface of a semiconductor layer with a first gate insulating film interposed therebetween;

a first channel region of a first conductivity type formed in the surface of the semiconductor layer close to a region located immediately below the first gate electrode, the first channel region having a first impurity concentration;

a first source region of the first conductivity type and a first drain region of the first conductivity type each formed in the surface of the semiconductor layer and each having a second impurity concentration higher than the first impurity concentration;

a first overlapping region of the first conductivity type formed in the surface of the semiconductor layer immediately below the first gate electrode where the first channel region overlaps the first source region and the first drain region, the first overlapping region having a third impurity concentration higher than the second impurity concentration;

a first contact region of the first conductivity type formed in at least a part of a surface of each of the first source region and the first drain region and having a fourth impurity concentration higher than the second impurity concentration; and a first impurity diffusion region of the first conductivity type formed in a partial region of one of the first source region and the first drain region and having a fifth impurity concentration higher than the second impurity concentration and lower than the fourth impurity concentration, and the first impurity diffusion region is formed in contact with the first contact region and away from the first overlapping region and positioned at least in a region between the first contact region and the first overlapping region.

A depletion MOS transistor according to an aspect of the present invention includes:

a gate electrode disposed on a surface of a semiconductor layer with a gate insulating film interposed therebetween;

a channel region of a first conductivity type formed in the surface of the semiconductor layer close to a region located immediately below the gate electrode, the channel region having a first impurity concentration;

a source region of the first conductivity type and a drain region of the first conductivity type each formed in the surface of the semiconductor layer and each having a second impurity concentration higher than the first impurity concentration;

an overlapping region of the first conductivity type formed in the surface of the semiconductor layer immediately below the gate electrode where the channel region overlaps the source region and the drain region, the overlapping region having a third impurity concentration higher than the second impurity concentration;

a contact region of the first conductivity type formed in at least a part of a surface of each of the source region and the drain region and having a fourth impurity concentration higher than the second impurity concentration; and an impurity diffusion region of the first conductivity type formed in a partial region of one of the source region and the drain region and having a fifth impurity concentration higher than the second impurity concentration and lower than the fourth impurity concentration, wherein the impurity diffusion region is formed in contact with the contact region and away from the overlapping region and positioned at least in a region between the contact region and the overlapping region.

An enhancement MOS transistor according to an aspect of the present invention includes:

a gate electrode formed on a surface of a semiconductor layer with a gate insulating film interposed therebetween;

a source region of the first conductivity type and a drain region of the first conductivity type each formed in the surface of the semiconductor layer and each having a first impurity concentration;

a contact region of the first conductivity type formed in at least a part of a surface of each of the source region and the drain region and having a second impurity concentration higher than the first impurity concentration; and an impurity diffusion region of the first conductivity type formed in a partial region of each of the source region and the drain region and having a third impurity concentration higher than the first impurity concentration and lower than the second impurity concentration, wherein the impurity diffusion region is formed in contact with the contact region and positioned at least in a region between the contact region and the gate electrode.

BRIEF DESCRIPTION OF THE SEVERAL VIEWS OF THE DRAWING

FIG. 7 is a circuit diagram of a row decoder according to the first embodiment;

FIG. 8 is a plan view of a D-type MOS transistor according to the first embodiment;

FIG. 10 is a plan view of the D-type MOS transistor;

FIG. 20 and FIG. 21 are graphs showing the voltage-current characteristics of the D-type MOS transistors according to the first embodiment and comparative example;

FIG. 22 is a graph showing the resistance-breakdown-voltage characteristics of the D-type MOS transistor according to the first embodiment;

FIG. 25 is a plan view of a D-type MOS transistor according to a third embodiment of the present invention;

FIG. 26 is a sectional view taken along line 26-26 in FIG. 25;

FIG. 27A is a timing chart showing various signals during a write operation in a NAND flash memory operate according to the third embodiment;

FIG. 27C is a sectional view taken along line 27C-27C in FIG. 27B;

FIG. 28A is a plan view of an E-type MOS transistor according to a fourth embodiment of the present invention;

FIG. 28B is a plan view of an E-type MOS transistor according to a comparative example of the fourth embodiment;

FIG. 29A is a sectional view taken along line 29A-29A in FIG. 28A, and FIG. 29B is a sectional view taken along line 29B-29B in FIG. 28B;

FIG. 30A and FIG. 30B are graphs showing the impurity concentration distributions of the MOS transistors according to the fourth embodiment and the comparative example;

FIG. 31A and FIG. 31B are graphs showing the concentration distributions of phosphorous, arsenic, and boron in semiconductor substrates for the MOS transistors according to the fourth embodiment and the comparative example;

FIG. 38 is a sectional view of an E-type MOS transistor according to a modification of the fourth embodiment;

FIG. 39 is a sectional view of a D-type MOS transistor according to a fifth embodiment of the present invention.

DETAILED DESCRIPTION OF THE INVENTION

[First Embodiment]

A semiconductor device according to a first embodiment of the present invention will be described taking a NAND flash memory by way of example.

<General Configuration of the NAND Flash Memory>

Figure 1:
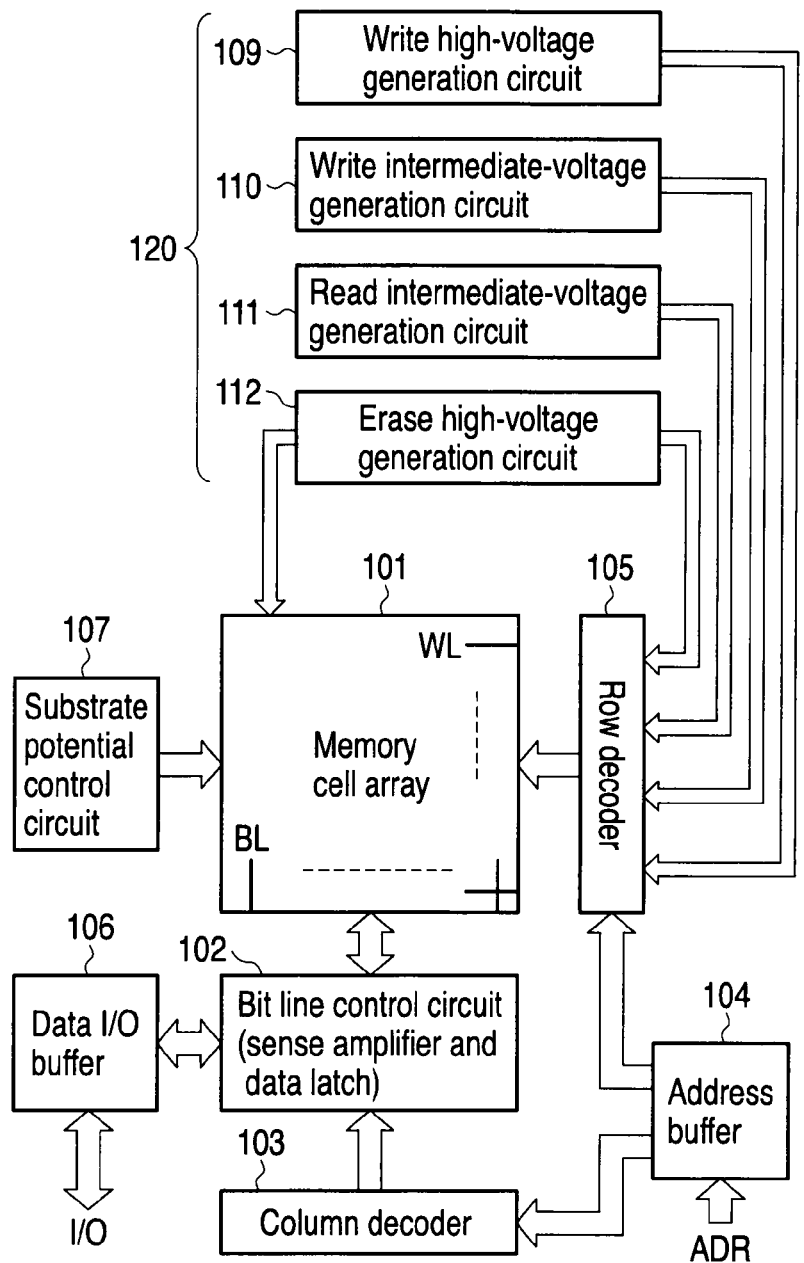
FIG. 1 is a block diagram of a NAND flash memory according to a first embodiment of the present invention.

First, the general configuration of a NAND flash memory according to the present embodiment will be described with reference to FIG. 1. FIG. 1 is a block diagram schematically showing the configuration of the NAND flash memory according to the present embodiment. As shown in FIG. 1, the NAND flash memory includes a memory cell array 101, a bit line control circuit (sense amplifier and data latch) 102, a column decoder 103, an address buffer 104, a row decoder 105, a data I/O buffer 106, a substrate potential control circuit 107, and a voltage generation circuit 120.

The bit line control circuit 102 performs data write, data read, data rewrite, and data verify read on the memory cell array 101. The bit line control circuit 102 is connected to the data I/O buffer 106, and receives output from the column decoder 103, which receives address signals from the address buffer 104.

Furthermore, the row decoder 105 controls control gates and select gates in the memory cell array 101. The substrate potential control circuit 107 controls the potential of a p-type silicon substrate (or a p-type well region) on which the memory cell array 101 is formed. Additionally, four types of the voltage generation circuits 120 are provided to generate voltages required for read, write, and the like and supplied to memory cells and the like. Specifically, a write high-voltage generation circuit 109 and a write intermediate-voltage generation circuit 110 are provided to generate a write high voltage VPGM (at most 20 V) and an intermediate voltage VPASS (at most 10 V), respectively, during a data write operation.

Moreover, a read intermediate voltage generation circuit 111 is provided to generate a read intermediate voltage VREAD during a data read operation. Furthermore, an erase high-voltage generation circuit 112 is provided to generate an erase high voltage VERA (at most 20 V) during an erase operation.

The bit line control circuit 102 mainly includes a CMOS flip flop and performs data latch for write, a sense operation for read of the potential of a bit line, a sense operation for verify read after write, and data latch for rewrite.

Figure 2:
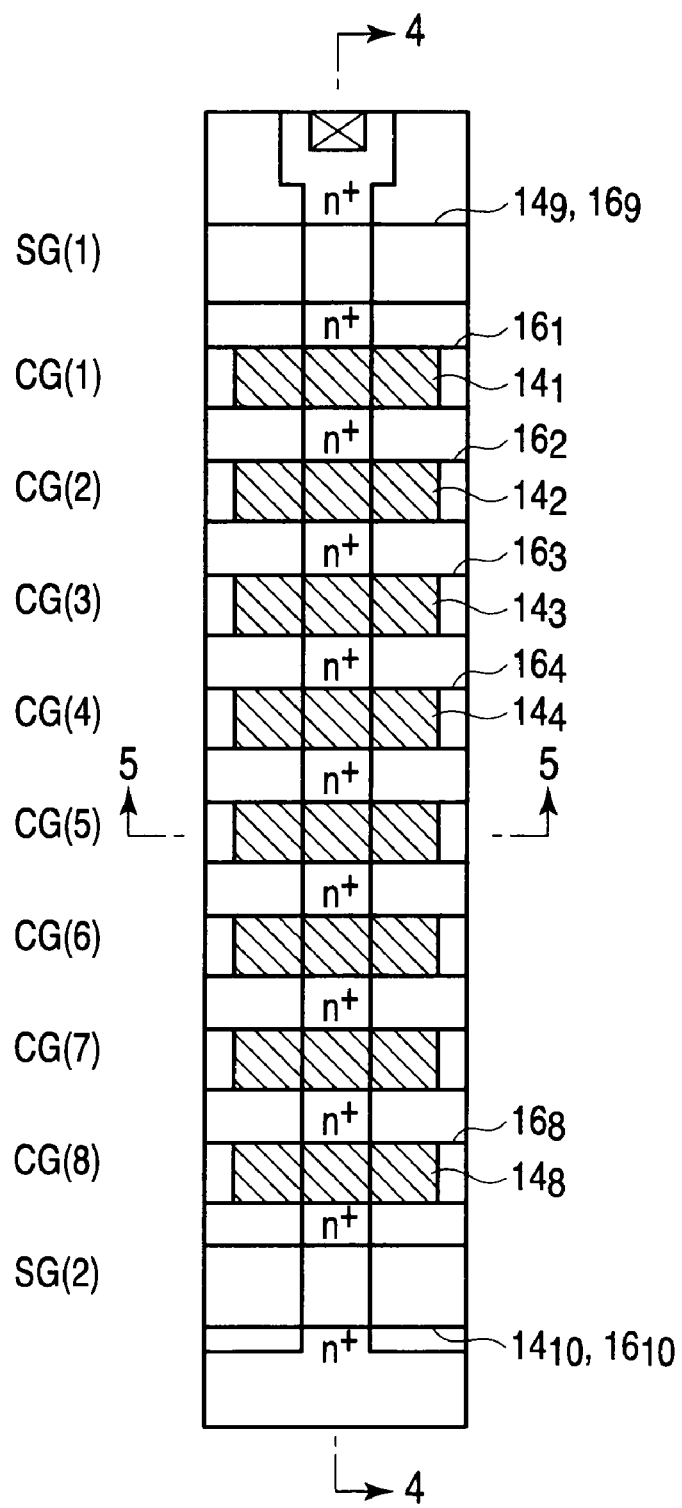
FIG. 2 and FIG. 3 are a plan view and an equivalent circuit diagram, respectively, of a NAND cell according to the first embodiment.
Figure 3:
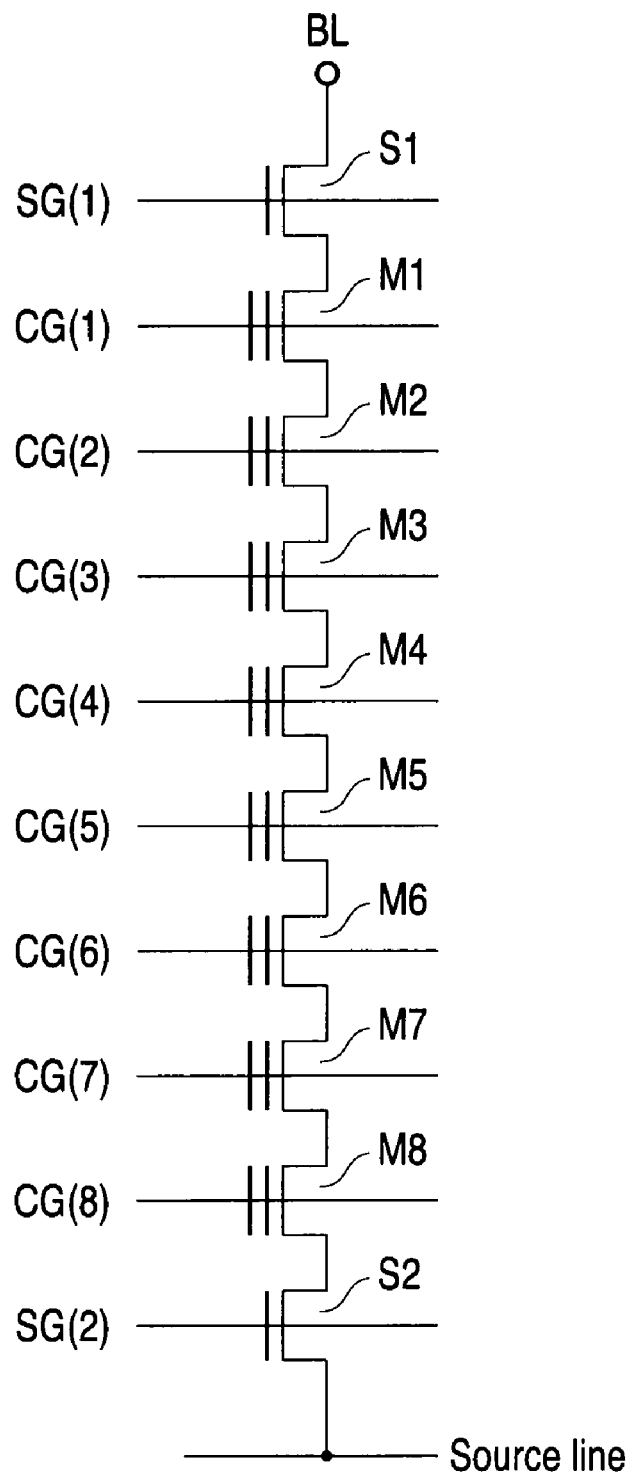
Figure 4:
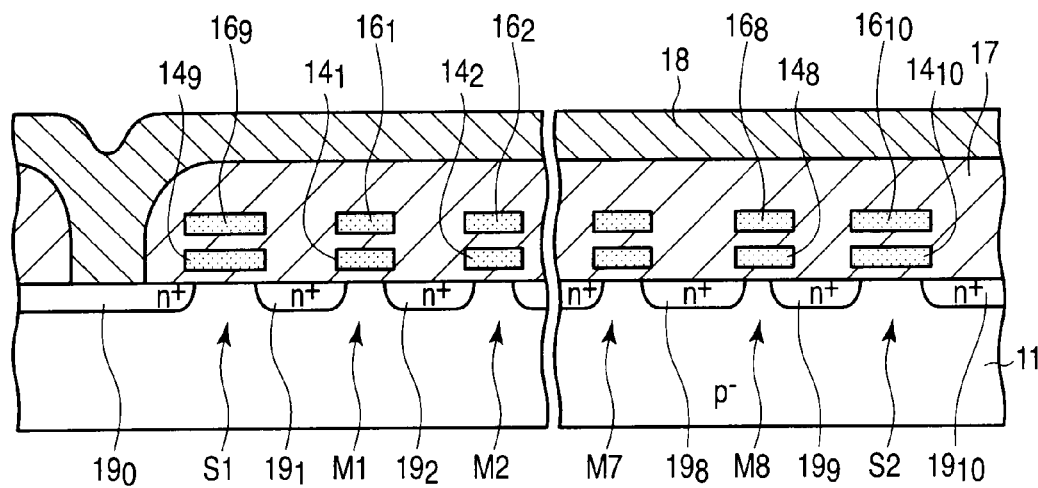
FIG. 4 and FIG. 5 are sectional views taken along lines 4-4 and 5-5, respectively, in FIG. 2.
Figure 5:
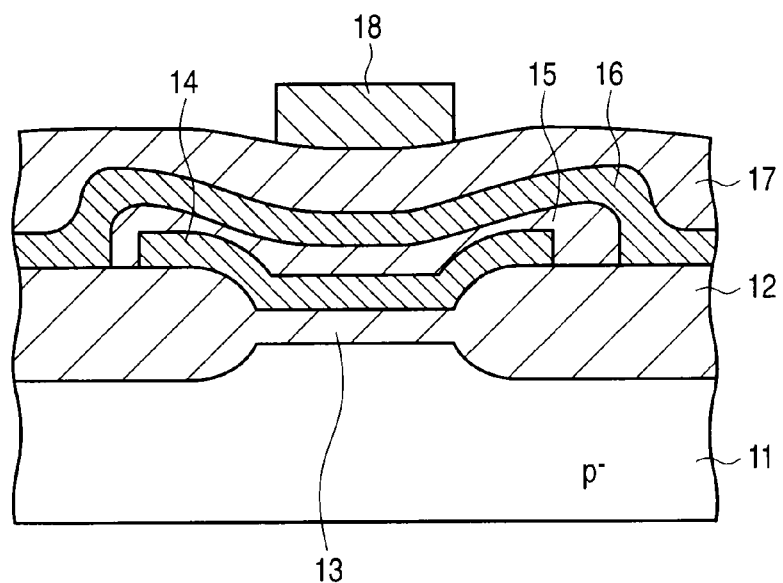

FIG. 2 and FIG. 3 are a plan view and an equivalent circuit diagram, respectively, of one NAND cell portion in the memory cell array 101. FIG. 4 and FIG. 5 are sectional views taken along lines 4-4 and 5-5, respectively, in FIG. 2.

The memory cell array including a plurality of NAND cells is formed on a p-type silicon substrate (or in a p-type well region) 11 surrounded by an isolation oxide film 12. One NAND cell will be focused on. In the present embodiment, for example, a plurality of memory cells Mi (i denotes a natural number of 1 to 8) are connected together in series to form one NAND cell. Here, for convenience of description, eight memory cells Mi are provided in one NAND cell. However, of course, the present embodiment is not limited to this configuration.

Each of the memory cells M1 to M8 includes a stack gate including a floating gate 14 ($14_1$, $14_2$, . . . , $14_8$) formed on the semiconductor substrate 11 with a gate insulating film 13 interposed therebetween and a control gate 16 (=word line: $16_1$, $16_2$, . . . , $16_8$) formed on the floating gate 14 with an insulating film 15 interposed therebetween. The memory cells are connected together so that the adjacent memory cells share an n-type impurity diffusion layer 19 ($19_0$, $19_1$, . . . , $19_{10}$) serving as a source and a drain for the memory cells. Thus, the memory cells are connected together in series.

Select gates $14_9$, $16_9$ and $14_{10}$, $16_{10}$ formed simultaneously with the floating gate and control gate of the memory cell are provided on the drain and source sides, respectively, of the NAND cell. Thus, select transistors S1 and S2 are formed. The surface of the semiconductor substrate 11 on which the elements are formed is covered with an insulating film 17. Bit lines 18 are formed on the insulating film 17. The bit lines 18 are connected to the drain-side diffusion layer $19_0$ at one end of the NAND cell. The control gates 16 of the NAND cell arranged in a row direction are formed so as to serve as control gate lines CG(1), CG(2), . . . , CG(8). The control gates function as word lines. The select gates $14_9$, $16_9$ and $14_{10}$, $16_{10}$ are disposed consecutively in the row direction so as to serve as select gate lines SG(1) and SG(2).

Figure 6:
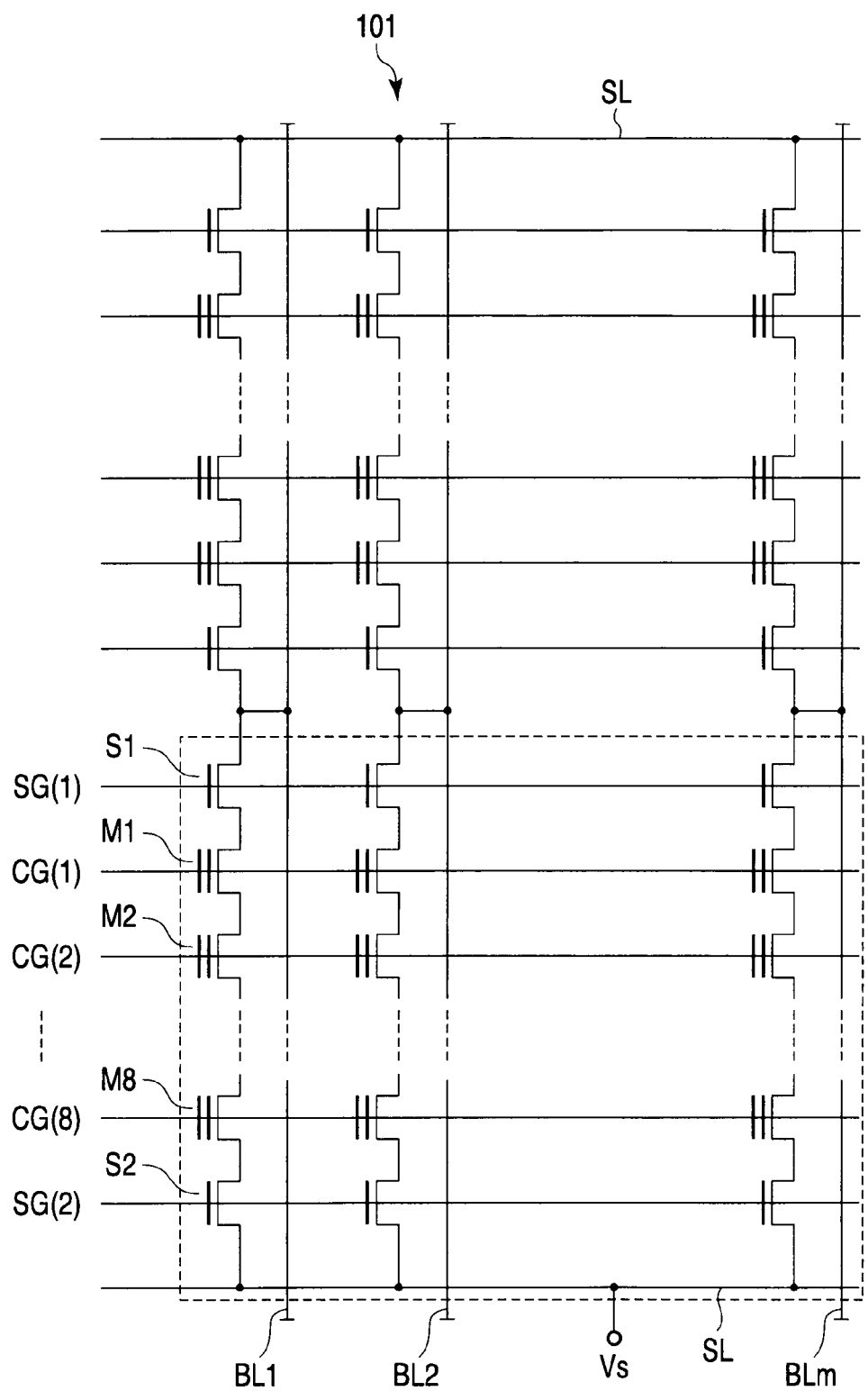
FIG. 6 is an equivalent circuit diagram of a memory cell array according to the first embodiment.

FIG. 6 is an equivalent circuit diagram of a memory cell array in which NAND cells are arranged in a matrix as described above. A group of NAND cells sharing the same word lines and select gate lines and enclosed by a dashed line in FIG. 6 is called a memory cell block. During a normal read operation and a normal write operation, one of the plurality of memory cell blocks is selected (this memory cell block is called a selected memory cell block).

<Configuration of the Row Decoder 105>

Now, the configuration of the above-described row decoder 105 will be described with reference to FIG. 7. FIG. 7 is a circuit diagram of the row decoder 105. In FIG. 7, a row decoder circuit 5 included in the row decoder 105 is located on one side of each memory cell block 2 in the memory cell array 101. The row decoder circuit 5 includes transfer transistors QN0 to QN11 (which have a threshold voltage Vth (QN)) connected to control gate lines CG(1) to CG(8) and select gate lines SG(1) and SG(2). In the circuit shown in FIG. 7, the MOS transistors QN0 to QN11 connected to the control gate lines CG(1) to CG(8) and select gate lines SG(1) and SG(2) are all of an enhancement-type (hereinafter referred to as E-type) n-channel high breakdown-voltage type. The MOS transistors QN0 to QN10 have a breakdown-voltage that is at least higher than the memory cell Mi, the select transistors S1 and S2, and low breakdown-voltage transistors (LNDs described below or the like). Each of the MOS transistors QN0 to QN10 includes a gate insulating film with a film thickness larger than those of insulting films in the memory cell Mi, the select transistors S1 and S2, and the transistor LND. Furthermore, each of the transistors QN1 to QN8 is connected to a corresponding one of the control gate lines CG(1) to CG(8).

That is, current paths in the n-channel MOS transistors QN1 to QN8 are connected between the respective control gate lines CG(1) to CG(8) and respective signal input nodes CGD1 and CGD8 of the control gate lines CG(1) to CG(8). Furthermore, current paths in the MOS transistors QN0 and QN9 are connected between the select gate line SG(1) and respective signal input nodes SGD and SGDS. Moreover, current paths in the MOS transistors QN10 and QN11 are connected between the select gate line SG(2) and respective signal input nodes SGS and SGDS.

Furthermore, the row decoder 105 includes a voltage switching circuit 54A configured to set gate voltages for the MOS transistors QN0 to QN11 to switch the voltages of the control gate lines CG(1) to CG(8) and the select gate lines SG(1) and SG(2). The voltage switching circuit 54A outputs an output voltage OUTPUT with a magnitude that varies depending on the switching of an input voltage INPUT and a control signal BSTON, to an output node N10. The input voltage INPUT is set to a power supply voltage Vdd if the voltage switching circuit 54A selects the memory cell block 2 connected to the voltage switching circuit 54A or to a reference voltage Vss (<Vdd) if voltage switching circuit 54A unselects the memory cell block 2. Additionally, the inverted signal /INPUT of the input voltage INPUT is input to a node N20, that is, the gate of the MOS transistor QN9 and QN11. Thus, only one of the MOS transistors QN0 and QN9 is electrically continuous. Similarly, only one of the MOS transistors QN11 and QN9 is electrically continuous.

In FIG. 7, instead of each of the n-channel MOS transistors QN to QN11, a transfer gate including a p-channel MOS transistor and an n-channel MOS transistor connected in parallel may be formed for each control gate or select gate.

The voltage switching circuit 54A includes transistors HND1 and HP between an output node N10 and a power supply node VRDEC; the transistor HP is connected in series with the transistor HND1 via a node N2 (source of the transistor HND1). The transistor HND1 is a high breakdown-voltage, depletion-type (hereinafter referred to as D-type), n-channel MOS transistor. The transistor HND1 has a threshold voltage Vth (HND1) with a negative value. The transistor HP is a high breakdown-voltage, E-type, p-channel MOS transistor. The transistor HP has a threshold voltage Vth (HP) with a negative value.

The transistor HND1 has a drain connected to the power supply node VRDEC, a source connected to the source of the transistor HP via the node N2, and a gate to which the output voltage OUTPUT is positively fed back. The transistor HND1 needs to offer a high breakdown-voltage because a high voltage is applied to between the source and the drain and to between the source and the gate. Thus, in the transistor HND1, the gate insulating film is formed to be thicker than in low breakdown-voltage transistors (LNDs described below) by, for example, forming the distance between the gate and a contact to be longer than in the low breakdown-voltage transistors. Furthermore, the threshold voltage Vth (HND1) has a negative value (D-type) so as to allow a high voltage applied to the power supply node VRDEC and gate to be transferred to the node N2.

Furthermore, in the voltage switching circuit 54A, inverter circuits INV1 and INV2, an n-channel MOS transistor LND, and an n-channel MOS transistor HND2 are connected together in series between the node N9, to which the input voltage INPUT is input, and the node N10; the n-channel MOS transistor LND offers a low breakdown-voltage and is of a D-type (that is, the n-channel MOS transistor LND has a negative threshold voltage Vth (LND)), and the n-channel MOS transistor HND2 (with a negative threshold voltage Vth (HND2)) offers a higher breakdown-voltage than the MOS transistor LND, and is of the D-type. The transistors LND and HND2 include a gate to which the control signal BSTON is applied and as a whole form a switching circuit. Since the MOS transistor HND2 offers a higher breakdown-voltage than the MOS transistor LND, the gate insulating film in the MOS transistor HND2 is larger than that in the MOS transistor LND.

A low voltage generated at the output node N10 may be applied to the gate electrode of the transistor HND1. Thus, the transistor HND1 needs to offer a high intrinsic breakdown-voltage at which the transistor is completely destroyed. On the other hand, the potential difference between the source and drain of the transistor HND1 is not so large. Thus, the transistor HND1 need not offer a high soft breakdown breakdown-voltage. In contrast, while the transistor HND2 is off, there is a large potential difference between the source and drain of the transistor HND2. Thus, the transistor HND2 needs to offer a high soft breakdown breakdown-voltage.

As described above, the voltage switching circuit 54A includes the D-type n-channel MOS transistors HND1 and HND2 and the E-type p-channel MOS transistor HP as high breakdown-voltage MOS transistors.

On the other hand, the MOS transistors QN0 to QN11 in the row decoder 5 are E-type n-channel MOS transistors. Thus, transistors in different forms are included in peripheral circuits configured to control the memory cell array 101, as high breakdown-voltage MOS transistors. In particular, the high breakdown-voltage D-type n-channel MOS transistors include those that need to offer an intrinsic breakdown-voltage and those that need to offer a soft breakdown breakdown-voltage.

<Configuration of the MOS Transistors HND1 and HND2>

Now, the configuration of the MOS transistors HND1 and HND2 will be described with a comparative example which is a high breakdown-voltage D-type n-channel MOS transistor. The MOS transistor used as each of the MOS transistors HND1 and HND2 is hereinafter referred to as a first MOS transistor. The MOS transistor according to the comparative example is hereinafter referred to as a second MOS transistor. The first and second MOS transistors undergo channel implantation in order to adjust the threshold voltage. In the comparative example (second MOS transistor), the D-type n-channel MOS transistor is subjected to channel implantation all over the active area, including a region in which the source/drain diffusion region is formed.

In contrast, in the first MOS transistors HND1 and HND2, the D-type n-channel MOS transistor is subjected to channel implantation only in the surface of a semiconductor layer close to a region located immediately below the gate electrode. Here, the term "close to a region located immediately below" means that a channel region obtained by channel implantation is formed to be slightly larger than the area of the gate electrode and to project from the end surface of the gate electrode by 10 nm to 1 µm in the direction of a current path. Thus, the channel region and the source/drain diffusion region overlap in a small region located immediately below the end surface of the gate electrode. The overlapping portion is hereinafter referred to as an "overlapping region". The overlapping region has a larger impurity concentration than the source/drain diffusion region.

Furthermore, in the present embodiment, a contact region with a high impurity concentration is formed in the source/drain diffusion layer. The contact region is designed to connect the source/drain diffusion layer to a contact plug. Moreover, an n-type impurity diffusion layer is formed in the source/drain diffusion layer so as to extend from a side surface of the contact region at least by 10 nm to 1 µm to surround the contact region. The impurity diffusion layer has a higher impurity concentration than the source/drain diffusion layer and is formed away from the overlapping region.

A detailed description will be given below.

<<Planar and Sectional Configurations>>

Figure 9:
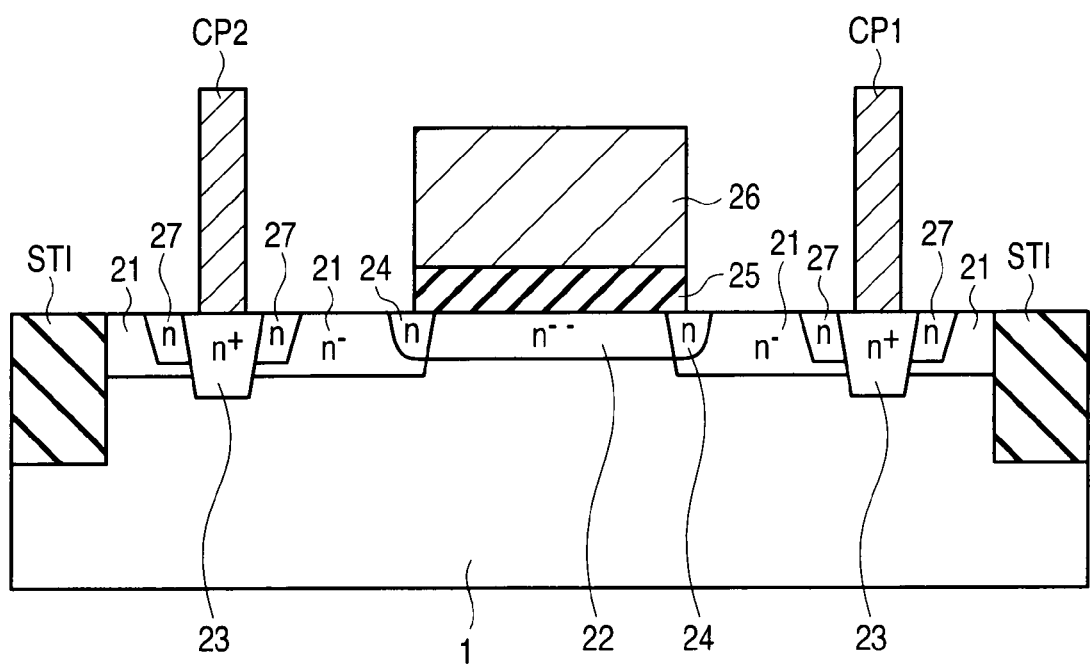
FIG. 9 is a sectional view taken along line 9-9 in FIG. 8.
Figure 11:
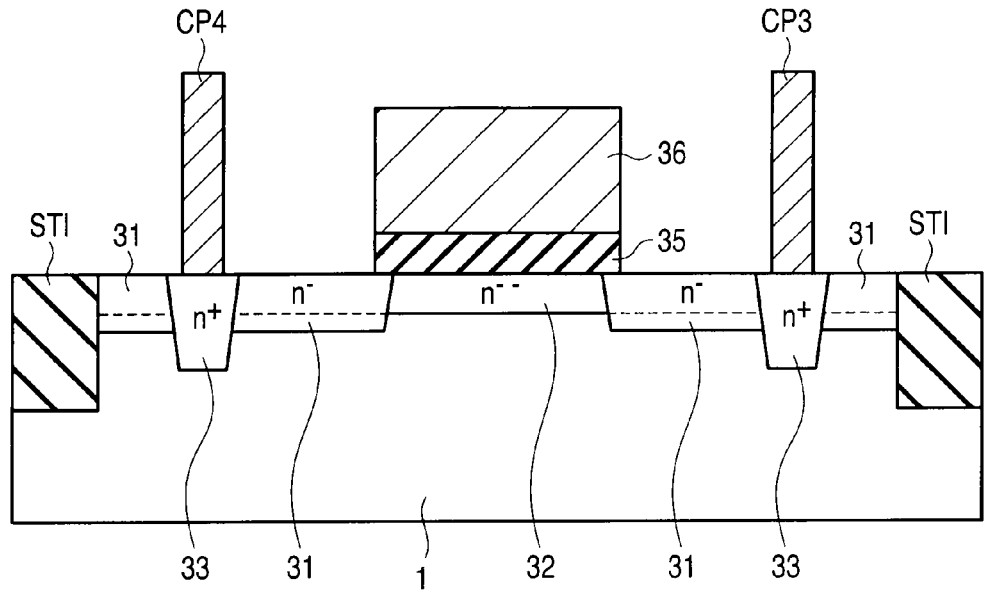
FIG. 11 is a sectional view taken along line 11-11 in FIG. 10.

First, the planar and sectional configurations will be described with reference to FIG. 8 to FIG. 11. FIG. 8 is a plan view of the first MOS transistors HND1 and HND2 according to the present embodiment. FIG. 9 is a sectional view taken along line 9-9 in FIG. 8. FIG. 10 is a plan view of a second MOS transistor according to a comparative example. FIG. 11 is a sectional view taken along line 11-11 in FIG. 10. The peripheral circuit for the NAND flash memory according to the present embodiment may include not only the first MOS transistor but also the second MOS transistor.

In the figures, symbols "+" and "−" following "n" indicate relative impurity concentrations. That is, an $n^+$-type contains a higher concentration of impurities than an n-type. An $n^-$-type contains a lower concentration of impurities than the n-type. An $n^{--}$-type contains a lower concentration of impurities than the $n^-$-type.

The first MOS transistor will be described with reference to FIG. 8 and FIG. 9. As shown in the figures, an element region AA is provided which is surrounded by an isolation region STI. The first MOS transistor HND1 or HND2 is formed on the element region AA.

The first MOS transistor HND1 or HND2 includes a source/drain diffusion region 21, a channel region 22, an overlapping region 24, a contact region 23, an impurity diffusion layer 27, a gate insulating film 25, and a gate electrode 26.

The source/drain diffusion region 21 is formed in the surface of the p-type semiconductor substrate 1 and is an $n^-$-type impurity diffusion layer. The source/drain diffusion region 21 functions as the source or drain of the first MOS transistor HND1 or HND2. When the source diffusion region and the drain diffusion region are distinguished from each other, the source/drain diffusion region 21 is called the source diffusion region 21 or the drain diffusion region 21. The source diffusion region 21 and the drain diffusion region 21 are formed away from each other in the surface of the semiconductor substrate 1. These diffusion regions are formed by implanting ions into the gate electrode 26 in a self-aligned manner. The type of impurity used for ion implantation is, for example, phosphorous.

The gate electrode 26 is formed on the semiconductor substrate 1 between the source diffusion region 21 and the drain diffusion region 21 with the gate insulating film 25 interposed therebetween. Furthermore, the gate electrode 26 is disposed to traverse the element region AA.

The channel region 22 is formed only in the vicinity of the region located immediately below the gate electrode 26 and the gate insulating film 25. The channel region 22 also has a size such that the channel region 22 projects from the ends of the gate electrode 26 by 10 nm to 1 μm. The channel region 22 is an n$^{--}$-type impurity diffusion layer having a lower impurity concentration than the source/drain diffusion region 21 and is formed by ion implantation.

Impurities for the ion implantation for formation of the channel region 22 are different from, for example, those for the source/drain diffusion region 21, in order to make shallower. For example, arsenic (As) is used. Owing to the presence of the channel region 22, the D-type MOS transistor has a threshold voltage of at most 0 V. That is, even if the gate-source voltage is 0 V, a channel is formed.

In the overlapping region 24, the source/drain diffusion region 21 and the channel region 22 overlap. As described above, the channel region 22 projects from the end of the gate electrode 26 by 10 nm to 1 μm. Thus, the channel region 22 overlaps the source/drain region 21 to form the overlapping region 24. The source/drain diffusion region 21 may also be located in a region immediately below the gate electrode 26. In this case, the overlapping region 24 is also formed in the region immediately below the gate electrode 26. Thus, the overlapping region 24 is an n-type region having a higher impurity concentration than the source/drain diffusion region 21 and the channel region 22. The overlapping region 24 contains different, plural types of impurities, that is, the impurities (P) in the source/drain diffusion region 21 and the impurities (As) in the channel region 22.

The contact region 23 is formed in each of the source diffusion region 21 and the drain diffusion region 21. The contact region 23 is an n$^+$-type impurity diffusion layer formed by ion implantation of the same impurities as those in the channel region 22, for example, arsenic and has a higher impurity concentration than the source diffusion region 21 and the overlapping region 24. Furthermore, the contact region 23 is formed away from the overlapping region 24. Contact plugs CP1 and CP2 are disposed on the contact region 23.

The impurity diffusion layer 27 is formed in each of the source diffusion region 21 and the drain diffusion region 21. The impurity diffusion layer 27 is an n-type impurity diffusion layer formed by ion implantation of n-type impurities and has an impurity concentration that is higher than those of the source diffusion region 21 and the channel region 22 and lower than that of the contact region 23. Furthermore, the impurity concentration in the impurity diffusion layer 27 may be the same as or higher than that of the overlapping region 24. Additionally, the impurity diffusion layer 27 is formed in contact with the contact region 23 and so as to the surround the periphery of the contact region 23 in the plane of the semiconductor substrate 1. The impurity diffusion layer 27 is also formed away from the overlapping region 24.

Here, the impurity diffusion layer 27 may be formed by superimposing the source/drain region 21 onto the channel region 22. In this case, the impurity concentration in the impurity diffusion layer 27 is almost the same as that of the overlapping region 24. The position of the bottom of the impurity diffusion layer 27 is also almost the same as that of the bottom of the overlapping region 24. The impurity distribution in the impurity diffusion layer 27 is also almost the same as that in the overlapping region 24. However, since impurities diffuse from the contact region 23 by thermal diffusion, the following is possible: that is, that the impurity concentration in the impurity diffusion layer 27 is higher than that of the overlapping region 24, and the position of the bottom of the impurity diffusion layer 27 is deeper than that of the overlapping region 24, thus the impurity distribution in the impurity diffusion layer 24 is different from that in the overlapping region 24.

In FIG. 9, the above-described regions 22 to 24 and 27 and the gate insulating film 25 are formed in the surface of the semiconductor substrate 1. However, the present embodiment is not limited to this example. The above-described regions 22 to 24 and 27 and the gate insulating film 25 may be formed, for example, in the surface of a p-type well region formed on the surface of the semiconductor substrate 1.

Now, the configuration of the second MOS transistor will be described with reference to FIG. 10 and FIG. 11. The second MOS transistor is also used in the NAND flash memory shown in FIG. 1 and used in, for example, the row decoder 105 (this is not shown in the drawings).

As shown in FIG. 10 and FIG. 11, an element region AA is provided which is surrounded by an isolation region STI. The second MOS transistor includes a source/drain diffusion region 31, a channel region 32, a contact region 33, a gate insulating film 35, and a gate electrode 36.

The source/drain diffusion region 31 is formed in the surface of the p-type semiconductor substrate 1 and is an n$^-$-type impurity diffusion layer. The source/drain diffusion region 31 functions as the source or drain of the second MOS transistor. In case, the source diffusion region and the drain diffusion region are distinguished from each other, the source/drain diffusion region 31 is called the source diffusion region 31 or the drain diffusion region 31. The source diffusion region 31 and the drain diffusion region 31 are formed away from each other in the surface of the semiconductor substrate 1. These diffusion regions are formed by implanting ions into the gate electrode 36 in a self-aligned manner. The type of impurity used for ion implantation is, for example, phosphorous.

The gate electrode 36 is disposed on the semiconductor substrate 1 between the source diffusion region 31 and the drain diffusion region 31 with the gate insulating film 35 interposed therebetween. Furthermore, the gate electrode 36 is disposed to traverse the element region AA.

The channel region 32 is an n$^{--}$-type impurity diffusion layer formed in the surface of the semiconductor substrate 1 and has a lower impurity concentration that the source/drain diffusion region 31. Impurities for the ion implantation for formation of the channel region 32 are different from, for example, those for the source/drain diffusion region 31. For example, arsenic (As) may be used.

The contact region 33 is formed in each of the source diffusion region 31 and the drain diffusion region 31. The contact region 33 is an n$^+$-type impurity diffusion layer formed by ion implantation of the same impurities as those in the channel region 32, for example, arsenic and has a higher impurity concentration than the source diffusion region 31. Contact plugs CP3 and CP4 are formed on the contact region 33.

That is, the second MOS transistor corresponds to the first MOS transistor from which the impurity diffusion layer 27 is omitted. Moreover, the overlapping region 24 is omitted from the first MOS transistor, and the channel region 22 is formed all over the element region AA. In other words, the overlapping region is formed all over the surface of the source/drain region 31. Thus, the impurity concentration in the surface of the source/drain diffusion region 31 is higher than that of the channel region 32. Hence, in other words, since in the first MOS transistor, the source/drain diffusion region 21 does not overlap the channel region 22 except for the overlapping region 24, the impurity concentration in the source/drain diffusion region 21 of the first MOS transistor is lower than that of the source/drain diffusion region 31 of the second MOS transistor.

<<Impurity Concentration Distribution>>

Figure 12:
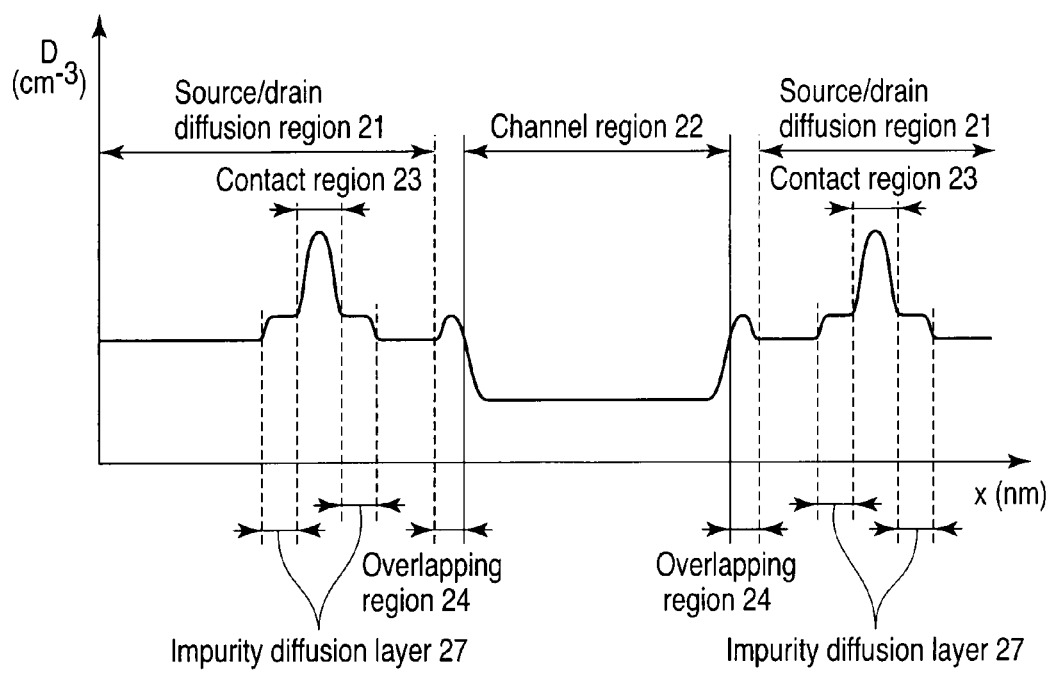
FIG. 12 is a graph showing the impurity concentration distribution of the MOS transistor shown in FIG. 8 and FIG. 9.

Now, the impurity concentration distributions of the first and second MOS transistors will be described. FIG. 12 is a graph showing the distribution, along a channel length direction, of the maximum values (peak concentrations) of the n-type impurity concentration D in the regions 21 to 24 and 27 of the first MOS transistors HND1 and HND2 according to the present embodiment shown in FIG. 8 and FIG. 9. Further, FIG. 13 is graph showing the distribution, along the channel length direction, of the maximum values (peak concentrations) of the n-type impurity concentration D in the regions 31 to 34 of the second MOS transistor shown in FIG. 10 and FIG. 11.

Figure 13:
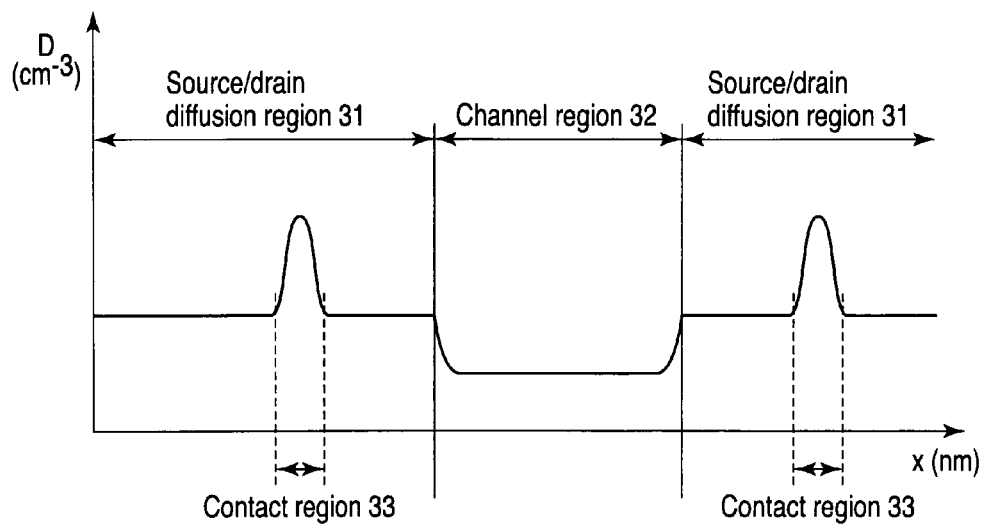
FIG. 13 is a graph showing the impurity concentration distribution of the MOS transistor shown in FIG. 10 and FIG. 11.

As shown in FIG. 12 and FIG. 13, in the first MOS transistors HND1 and HND2, the presence of the impurity diffusion layer 27 makes the impurity concentration at the periphery of the contact region 23 higher than that of the source/drain diffusion region 21. In other words, the gradient of a variation in the impurity concentration from the contact region 23 through the source/drain diffusion region 21 is gentler than that in the comparative example.

FIG. 12 shows a distribution with a step between the contact region 23 and the impurity diffusion layer 27, for the sake of convenience. However, in actuality, the boundary between the contact region 23 and the impurity diffusion layer 27 is curved such that the impurity concentration decreases gradually from the contact region 23 toward the impurity diffusion layer 27.

This also applies to the step between the impurity diffusion layer 27 and the source/drain diffusion region 21. In actuality, the boundary between the impurity diffusion layer 27 and the source/drain diffusion region 21 is curved such that the impurity concentration decreases gradually from the impurity diffusion layer 27 toward the source/drain diffusion region 21.

Moreover, in the first MOS transistors HND1 and HND2, the presence of the overlapping region 24 makes the impurity concentration at the end of the channel region higher than that in the source/drain diffusion region 21.

In the regions 21 to 23 and 37 of the first MOS transistors HND1 and HND2, the maximum value (peak concentration) of the impurity concentration and a junction depth are as follows, by way of example. The channel region 22 has a peak concentration of $1 \times 10^{17}$ to $5 \times 10^{17}$ [cm$^{-3}$] and a junction depth of at most 300 [nm]. The source/drain diffusion region 21 has a peak concentration of $5 \times 10^{17}$ to $3 \times 10^{18}$ [cm$^{-3}$] and a junction depth of at most 250 [nm]. The contact region 23 has a peak concentration of $1 \times 10^{19}$ to $1 \times 10^{21}$ [cm$^{-3}$] and a junction depth of at most 300 [nm]. The overlapping region 24 has a peak concentration of $6 \times 10^{17}$ to $3.5 \times 10^{18}$ [cm$^{-3}$] and a junction depth of at most 300 [nm]. The impurity diffusion layer 27 has a peak concentration of $6 \times 10^{17}$ to $3.5 \times 10^{18}$ [cm$^{-3}$] and a junction depth of at most 300 [nm].

In the regions 31 to 33 of the second MOS transistor, the peak concentration, a peak depth, and the junction depth are as follows, by way of example. The channel region 32 has a peak concentration of $1 \times 10^{17}$ to $5 \times 10^{17}$ [cm$^{-3}$] and a junction depth of at most 300 [nm]. The source/drain diffusion region 31 has a peak concentration of $6 \times 10^{17}$ to $3.5 \times 10^{18}$ [cm$^{-3}$] and a junction depth of at most 300 [nm]. The contact region 33 has a peak concentration of $1 \times 10^{19}$ to $1 \times 10^{21}$ [cm$^{-3}$] and a junction depth of at most 300 [nm].

Figure 14:
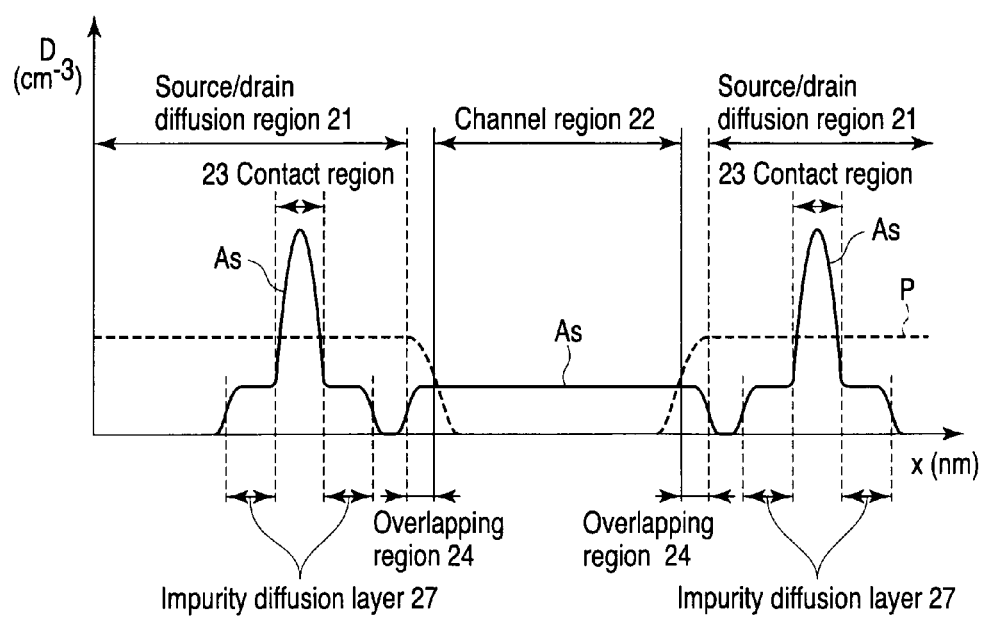
FIG. 14 is a graph showing the concentration distributions of phosphorous and arsenic in a semiconductor substrate of the MOS transistor shown in FIG. 8 and FIG. 9.
Figure 15:
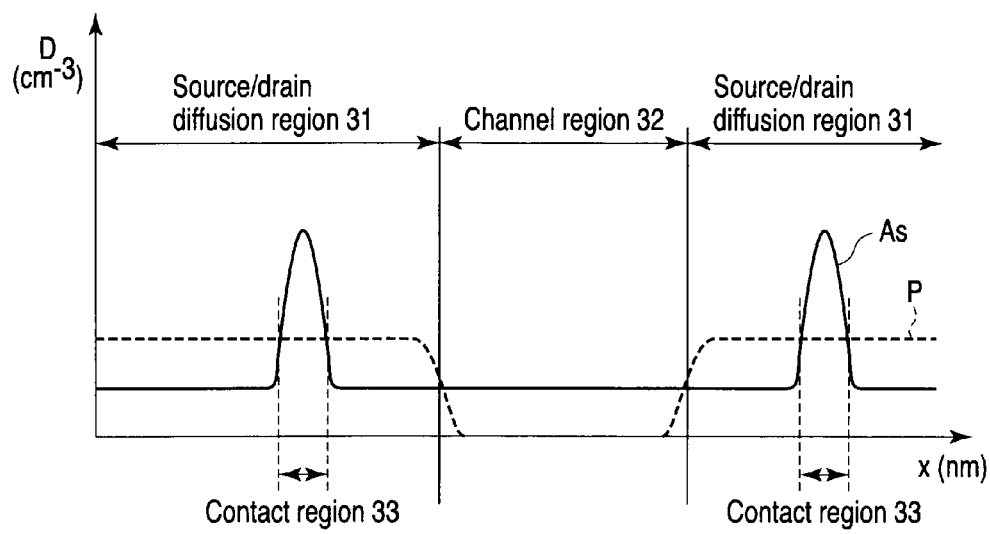
FIG. 15 is a graph showing the concentration distributions of phosphorous and arsenic in a semiconductor substrate of the MOS transistor shown in FIG. 10 and FIG. 11.

Furthermore, FIG. 14 is a graph showing the distributions, along the channel length direction, of concentrations of phosphorous (P) and arsenic (As) in the regions 21 to 24 and 27 of the first MOS transistors HND1 and HND2 according to the present embodiment shown in FIG. 8 and FIG. 9. FIG. 15 is a graph showing the distributions, along the channel length direction, of concentrations of phosphorous (P) and arsenic (As) in the regions 31 to 34 of the second MOS transistor shown in FIG. 10 and FIG. 11. FIG. 14 also shows that arsenic (As) is used to form an impurity diffusion layer 27.

As shown in FIG. 14, in the first MOS transistors HND1 and HND2, no arsenic is implanted into the source/drain diffusion region 21 except for the overlapping region 24, the impurity diffusion layer 27, and the contact region 23. In contrast, in the second MOS transistor shown in FIG. 15, arsenic is implanted into the entire source/drain diffusion region 21.

<Manufacturing Method>

Now, a manufacturing method for the above-described first and second MOS transistors will be described with reference to FIG. 16 to FIG. 19. FIG. 16 to FIG. 19 are sectional views sequentially showing the manufacturing steps for the first and second MOS transistors. In each drawing, the first MOS transistor is located on the left side, whereas the second MOS transistor is located on the right side.

Figure 16:
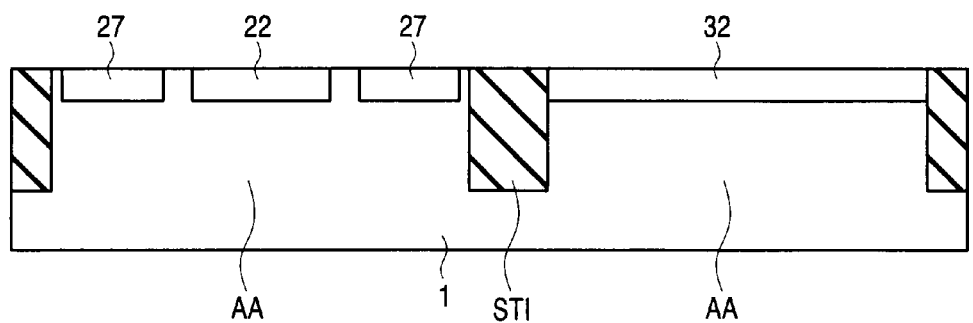
FIG. 16 to FIG. 19 are sectional views sequentially showing the first to fourth manufacturing steps for D-type MOS transistors according to the first embodiment and a comparative example.

As shown in FIG. 16, an isolation insulating film STI is formed in the semiconductor substrate 1. Then, channel implantation is performed using arsenic (As) as an impurity to form channel regions 22 and 32 and an impurity diffusion layer 27. Using, for example, a photolithography technique and a photoresist as a mask, the channel region 22 and the impurity diffusion layer 27 are formed close to a region immediately below the region in which a gate electrode 26 is to be subsequently formed and in the region in which a contact region 23 is to be subsequently formed. On the other hand, the channel region 32 is formed all over the element region of the second MOS transistor.

The channel regions 22 and 32 and the impurity diffusion layer 27 may be formed during the same step in order to simplify the steps. As a result, the impurity concentrations in the channel regions 22 and 32 of the first and second transistors are almost the same.

Figure 17:
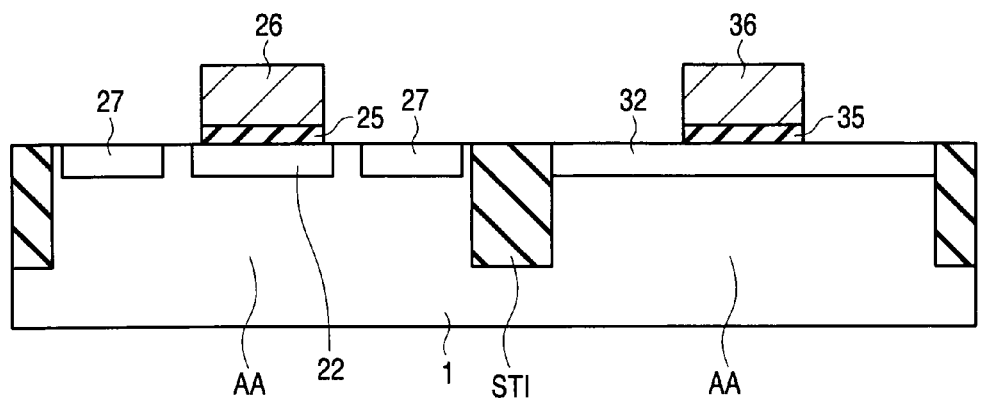

As shown in FIG. 17, gate electrodes 26 and 36 are formed with the gate insulating films 25 and 35 interposed therebetween, respectively.

Figure 18:
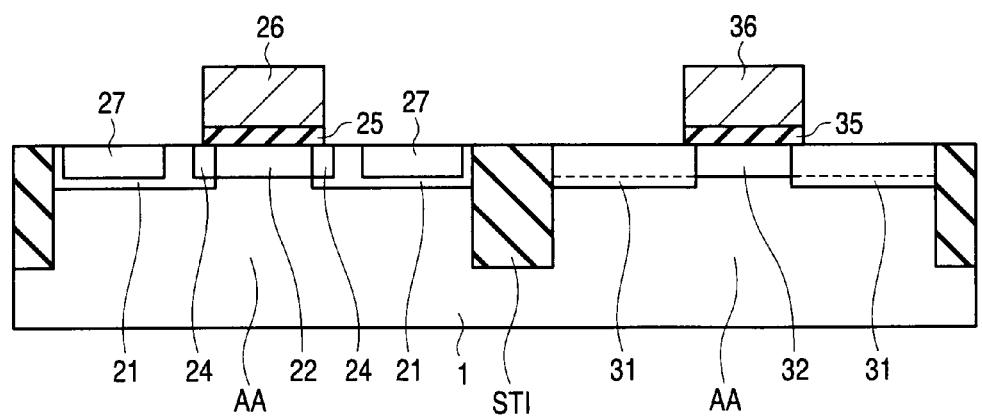

As shown in FIG. 18, ion implantation with phosphorous (P) as an impurity is performed in a self-aligned manner through the gate electrodes 26 and 36 as masks as shown in FIG. 18. Source/drain diffusion regions 21 and 31 are thus formed. At this time, the channel region 22 is formed only in the vicinity of the region immediately below the gate electrode 26. Thus, the overlapping region 24 is formed immediately below the end surface of the gate electrode 26 where the channel region 22 and the source/drain diffusion region 21 overlap. Furthermore, the source/drain diffusion regions 21 and 31 are formed so as to surround the periphery of the impurity diffusion layer 27. Thus, the impurity concentration in the impurity diffusion layer 27 is the sum of the ion implantation concentration in FIG. 16 and the ion implantation concentration in the present step.

Here, the source/drain diffusion regions 21 and 31 may be formed during the same step in order to simplify the steps. As a result, the source/drain diffusion regions 21 and 31 of the first and second transistors have almost the same impurity concentration. Furthermore, the impurity concentration in the overlapping region 24 of the first transistor is equal to that in the surface region (which overlaps the channel region 22) of the source/drain diffusion regions 31 of the second transistor.

Figure 19:
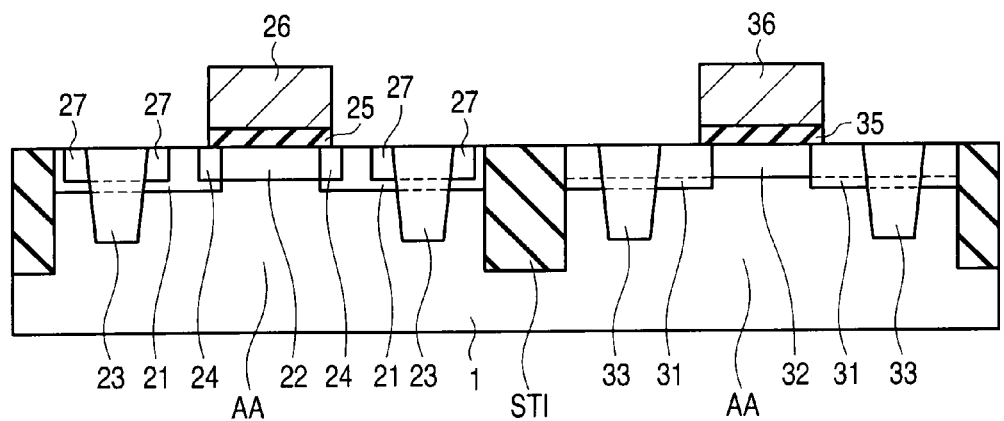

As shown in FIG. 19, for example, arsenic (As) is further ion-implanted into a part of each of the source/drain diffusion regions 21 and 31 to form a contact region 23 or 33, respectively. The contact region 23 is formed so as to penetrate the impurity diffusion layer 27 and the source/drain diffusion region 21. As a result, the first and second MOS transistors are completed.

In case the channel regions 22 and 32 and source/drain diffusion regions 21 and 31 of the first and second transistors are simultaneously formed, the first and second transistors with different breakdown-voltage characteristics can be simultaneously formed on the semiconductor substrate without an increase in the number of required steps.

<Effects>

As described above, in the semiconductor memory device according to the first embodiment of the present invention, in the high breakdown-voltage D-type MOS transistor, the impurity diffusion layer 27 is formed around the periphery of the contact region 23. This allows improvement of the breakdown-voltage of the first MOS transistor, more specifically a junction breakdown-voltage and a surface breakdown-voltage. This effect will be described below.

The junction breakdown-voltage is the breakdown-voltage of the pn junction between the semiconductor substrate (or a well region) and both the source and drain, when a certain voltage is applied to the gate, the source, and the drain. Furthermore, the surface breakdown-voltage is the breakdown-voltage of the pn junction between the source or drain and a portion of the semiconductor substrate (well region) which is close to the gate, when a high potential difference occurs between the source or drain and the gate to which 0 V is applied.

Figure 20:
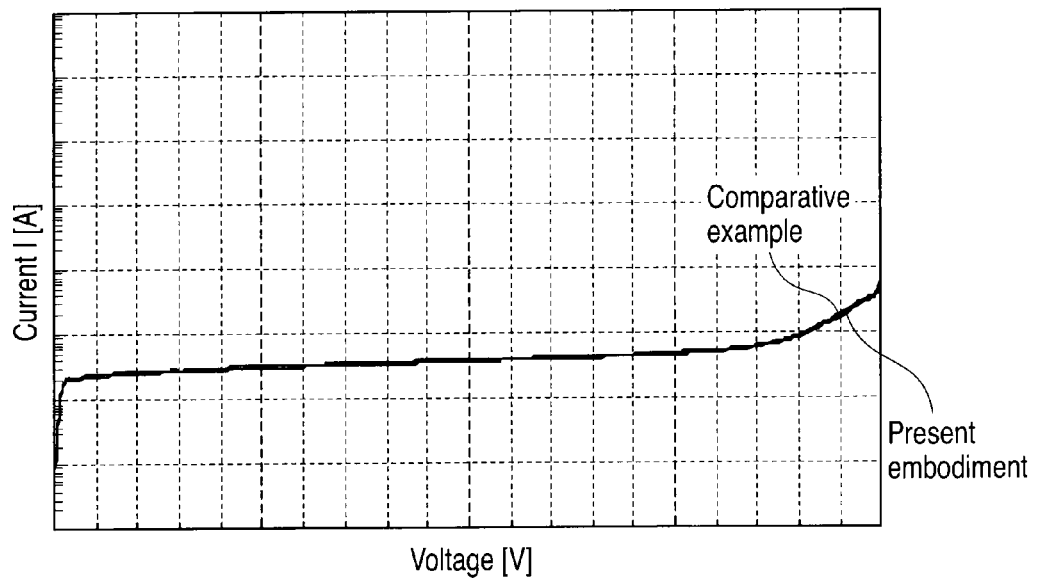

FIG. 20 is a graph showing the junction breakdown-voltages of the first and second MOS transistors. In the graph, the axis of abscissa shows the source and drain voltage, and the axis of ordinate shows a current flowing through the above-described pn junction. In this case, the source voltage is equal to the drain voltage, and the semiconductor substrate is at 0 V.

FIG. 21 is a graph showing the surface breakdown-voltages of the first and second MOS transistors. In the graph, the axis of abscissa shows the drain voltage, and the axis of ordinate shows a current flowing through the above-described pn junction. In this case, both the gate voltage and the source voltage are 0 V, and the semiconductor substrate is also at 0 V.

FIG. 22 is a graph showing the junction breakdown-voltage and surface breakdown-voltage of the first MOS transistor. In the graph, the axis of abscissa shows the sheet resistance of the source/drain diffusion region 21, and the axis of ordinate shows the breakdown-voltage (breakdown voltage of the pn junction).

Figure 23:
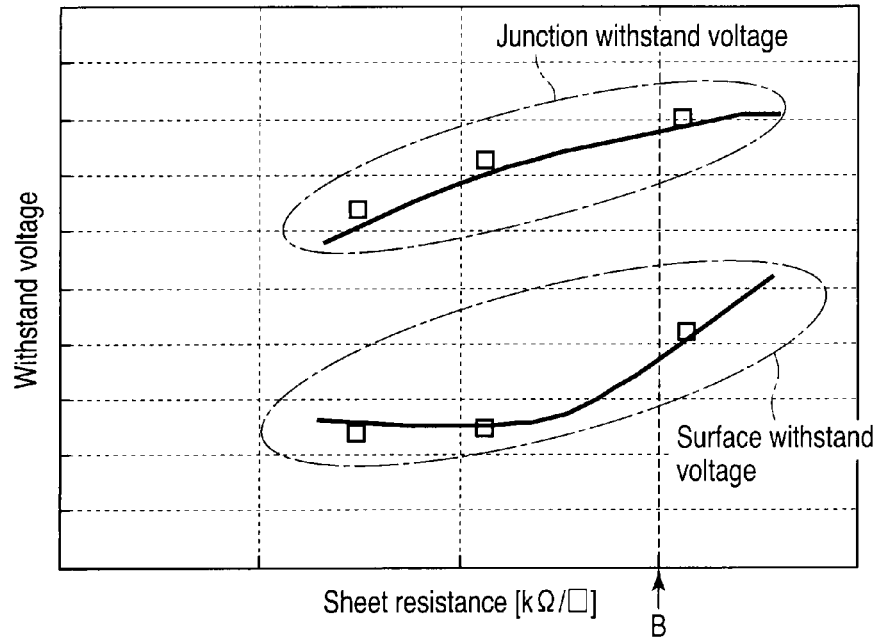
FIG. 23 is a graph showing the resistance-breakdown-voltage characteristics of the D-type MOS transistor according to the comparative example.

FIG. 23 is a graph showing the junction breakdown-voltage and surface breakdown-voltage of the second MOS transistor. In the graph, the axis of abscissa shows the sheet resistance of the source/drain diffusion region 31, and the axis of ordinate shows the breakdown-voltage (breakdown voltage of the pn junction).

In FIG. 20 and FIG. 21, the graph labeled as "present embodiment" shows the characteristics of the first MOS transistor. The graph labeled as "comparative example" shows the characteristics of the second MOS transistor. Further, the scales on each of the axes in FIG. 20 and FIG. 21 are the same. A log scale is used on the axis of ordinate. Further, the scales on each of the axes in FIG. 22 and FIG. 23 are the same. Furthermore, the term sheet resistance refers to the resistance of the source/drain diffusion regions 21 and 31 per unit area.

As shown in FIG. 21, as the voltage is increased, in the first MOS transistor, no current (leakage current) starts to flow until the voltage reaches a certain value larger than the value at which a current starts to flow through the second MOS transistor. That is, the first MOS transistor offers an improved surface breakdown-voltage compared to the second MOS transistor.

In FIG. 20, the junction breakdown-voltage of the first MOS transistor is similar to that of the second MOS transistor. However, when a voltage exceeding the illustrated range was applied, the first MOS transistor was observed to offer an improved breakdown-voltage. This is shown in FIG. 22 and FIG. 23.

FIG. 22 and FIG. 23 show that in the first MOS transistor, both the junction characteristics and the surface characteristics are improved. For example, the junction breakdown-voltage and surface breakdown-voltage at a point A in FIG. 22 are compared with those at a point B in FIG. 23; the sheet resistance at the point A is equal to that at the point B. Here, both at the points A and B, the present embodiment offers a higher breakdown-voltage than that of the comparative example. In particular, if the sheet resistance is low, the junction breakdown-voltage of the first MOS transistor is much higher than that of the second MOS transistor. If the sheet resistance is high, the surface breakdown-voltage of the first MOS transistor is higher than that of the second MOS transistor.

The above-described characteristics result from the provision of the impurity diffusion layer 27. The source/drain diffusion region 21, which offers a higher resistance than the source/drain diffusion region 31 of the conventional structure, is formed between the overlapping region 24 and the impurity diffusion layer 27. As a result, the gradient of the impurity concentration in the region of the first MOS transistor extending from the contact region 23 through the source/drain diffusion region 21 is gentler than that of the impurity concentration in the corresponding region of the second MOS transistor (see FIG. 12). This serves to reduce the concentration of electric fields at the pn junction between the source/drain diffusion region 21 and a portion of the semiconductor substrate 1 located close to the gate. Consequently, the surface breakdown-voltage can be improved.

Moreover, since the source/drain diffusion region 21, which offers a higher resistance than the source/drain diffusion region 31 of the conventional structure, is formed between the overlapping region 24 and the impurity diffusion layer 27, the gradient of the pn junction between the periphery of the contact region 23 and the semiconductor substrate 1 is weakened. This is because the provision of the impurity diffusion layer 27 results in a gradual variation in the n-type impurity concentration in the region extending from the contact region 23 through the source/drain diffusion region 21. As a result, the junction characteristics are improved.

[Second Embodiment]

Now, a semiconductor memory device according to a second embodiment of the present invention will be described. The present embodiment corresponds to the first MOS transistor described above in the first embodiment and in which the impurity diffusion layer 27 is deeper than the contact region 23. Only differences from the first embodiment will be described below.

Figure 24:
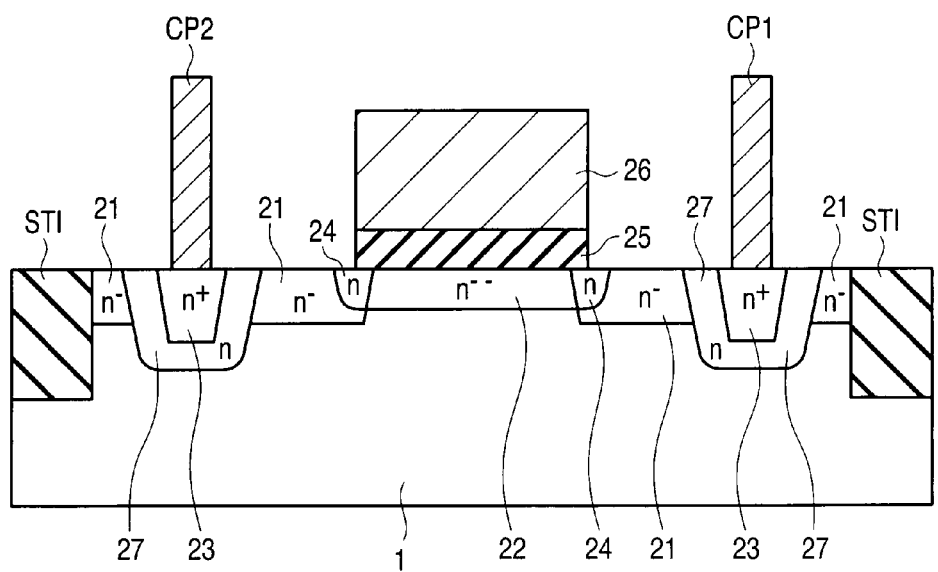
FIG. 24 is a sectional view of a D-type MOS transistor according to a second embodiment of the present invention.

FIG. 24 is a sectional view of a first MOS transistor according to the present embodiment. As shown in FIG. 24, a configuration according to the present embodiment corresponds to the configuration in FIG. 9 described in the first embodiment in which the impurity diffusion layer 27 is formed to be deeper than the contact region 23. In other words, the impurity diffusion layer 27 surrounds the periphery of the contact region 23 not only in the in-plane direction of the semiconductor substrate 1 but also in the depth direction of the semiconductor substrate 1. In other words, inside the semiconductor substrate 1, the impurity diffusion layer 27 surrounds the entire periphery of the contact region 23.

For example, the present configuration can be achieved by diffusing the impurity diffusion layer 27 formed in the first embodiment as shown in FIG. 18, in the depth direction of the semiconductor substrate 1 through the subsequent thermal step. That is, the impurity diffusion layer 27 is formed by overlapping implantation of the source/drain diffusion region 21 and implantation of an impurity diffusion layer for forming the channel region 22 (See FIG. 17). Here, in case the depth of the channel region 22 is closer to that of the source/drain diffusion region 21, the impurity concentration in the vicinity of the bottom of the impurity diffusion layer 27 increases. That is, because of thermal diffusion, phosphorous (P) forming the source/drain diffusion region 21 spreads easily in the depth direction of the semiconductor substrate 1. On the other hand, arsenic (As) forming the impurity diffusion layer 27 is heavier than phosphorous (P) and thus unlikely to undergo thermal diffusion. As a result, inside the semiconductor substrate 1, the impurity diffusion layer 27 can be formed to surround the entire periphery of the contact region 23.

Alternatively, the present configuration can be achieved by, in the step shown in FIG. 17, performing ion implantation for formation of an impurity diffusion layer 27 separately from and deeper than ion implantation for formation of a channel region 22. As a result, the impurity diffusion layer 27 can be deepened, with the channel region 22 shallowed.

<Effects>

In the configuration according to the present embodiment, the gradient of the impurity concentration around the periphery of the contact region 23 is gentler also in the depth direction of the semiconductor substrate 1. Thus, the breakdown-voltage of the first MOS transistor can be improved.

[Third Embodiment]

Now, a semiconductor memory device according to a third embodiment of the present invention will be described. The present embodiment corresponds to the first MOS transistor described in the first embodiment in which the impurity diffusion layer 27 is provided on only one of the source side and the drain side. Only differences from the first embodiment will be described below.

FIG. 25 is a plan view of a first MOS transistor according to the present embodiment. FIG. 26 is a sectional view taken along line 26-26 in FIG. 25.

As shown in the figures, the first MOS transistor according to the present embodiment corresponds to the configuration described in the first embodiment with reference to FIG. 8 and FIG. 9 in which the impurity diffusion layer 27 around the periphery of the contact region 23 on which the contact plug CP1 is formed is omitted.

For example, in the MOS transistor HND1, the source-side (one of the source and drain which is connected to the node N1) impurity diffusion layer 27 is omitted. The impurity diffusion layer 27 is provided only on the drain-side (one of the source and drain which is connected to VRDEC). That is, in FIG. 26, the contact plug CP2 is connected to VRDEC, and the contact plug CP1 is connected to the node N2.

Furthermore, in the MOS transistor HND2, the drain-side (one of the source and drain which is connected to the MOS transistor LND) impurity diffusion layer 27 is omitted. The impurity diffusion layer 27 is provided only on the source-side (one of the source and drain which is connected to the node N10). That is, in FIG. 26, the contact plug CP2 is connected to the node N10, and the contact plug CP1 is connected to the MOS transistor LND.

<Effects>

In the configuration according to the present embodiment, the impurity diffusion layer 27 is formed in a portion that needs a high breakdown-voltage and not in a portion the breakdown-voltage of which is not particularly problematic. This eliminates an extra margin (the alignment margin between the impurity diffusion layer 27 and the overlapping region 24 and the alignment margin between contact region 23 and the channel region 22) to form an impurity diffusion layer 27. The configuration according to the present embodiment thus improves the breakdown-voltage of the MOS transistor, which suppresses an increase in the size of the MOS transistor.

An example of the situation where the high breakdown-voltage is needed will be described in brief.

For example, in the MOS transistor HND1, the drain side (one of the source and drain which is connected to VRDEC) needs the high breakdown-voltage compared with the source side. In the MOS transistor HND2, the source side (one of the source and drain which is connected to the node N10) needs the high breakdown-voltage compared with the drain side.

FIG. 27A is a timing chart showing variations in the potentials of the signal BSTON, the voltage VRDEC, the select gate lines SG(1) and SG(2), and the control gate line CG during a data write operation performed on the NAND flash memory.

During a data programming, in the voltage switching circuit 54A corresponding to a memory cell block (hereinafter referred to as a selected memory block) containing a memory cell (hereinafter referred to as a selected memory cell) to which data is stored, the input signal INPUT is set to an "H" level (Vdd=1.5V). Thus, the node N1 is set to an "L" level (for example, Vss=0 V) to turn on the MOS transistor HP. Furthermore, at time t0 in FIG. 27A, the signal BSTON is set to the "H" level (for example, Vdd) to turn on both the MOS transistors LND and HND2. Hence, an output from the inverter INV2 at the "H" level (=Vdd) is transferred to the node N10. Moreover, since the voltage VRDEC is equal to Vdd, the MOS transistor HND1 is turned on. As a result, VRDEC (=Vdd) is transferred to the node N10 via the current paths in the MOS transistors HND1 and HP.

Then, at time t1, BSTON is set to the "L" level to cut off the MOS transistors LND and HND2. However, the MOS transistors HND1 and HP remain on. Thus, the node N10 maintains the "H" level (Vdd).

Then, at time t2, VRDEC is set equal to VPGMH. The voltage VPGMH enables the voltage VPGM to be transferred to the MOS transistors QN1 to QN8. The voltage VPGM is high enough (for example, 20 V) to implant electrons into a charge accumulation layer 14 by FN (Fowler-Nordheim) tunneling. VPGMH is higher than VPGM at least by an amount corresponding to the threshold of the MOS transistors HND1, HP, and QN1 to QN8. Setting VRDEC equal to VPGMH allows the node N10 to be set equal to VPGMH.

Then, at time t3, the voltage VPASS is supplied to the signal input nodes CGD1 to CGD8. The voltage VPASS allows the memory cell Mi to be turned on regardless of data held in the memory cell Mi. This allows the voltage VPASS to be transferred to the control gate lines CG(1) to CG(8). Furthermore, the voltages VSGD and Vss are applied to the signal output nodes SGD and SGS, respectively. The voltage VSGD allows the select transistor S1 to be turned on or off depending on write data.

Thereafter, at time t4, the voltage of the signal input node CGD connected to the selected memory cell is increased from VPASS to VPGM. As a result, in a NAND cell with the select transistor S1 turned on, programming data is transferred to the channel of the selected memory cell. Electrons are then implanted into the charge accumulation layer of the selected memory cell. On the other hand, in a NAND cell with the select transistor S1 turned off, the channel is electrically floated. The potential of the channel increases as a result of coupling to the control gate lines, suppressing the implantation of electrons into the charge accumulation layer.

In the above-described operation, after time t2, Vdd is applied to the drain of the MOS transistor HND2. VPGMH is applied to the source of the MOS transistor HND2. Thus, since the MOS transistor HND2 has a high breakdown-voltage on the source side, the impurity diffusion layer 27 is desirably formed on the source side.

Now, the voltage switching circuit 54A corresponding to a memory cell block (hereinafter referred to as an unselected memory cell block) containing no selected memory cell during the above-described programming will be described. In the voltage switching circuit 54A, INPUT is set to the "L" level (=Vss). Thus, the node N1 is set to the "H" level (=Vdd) to turn off the MOS transistor HP. Furthermore, the signal BSTON is set to the "H" level (for example, Vdd) to turn on both the MOS transistors LND and HND2. Thus, an output from the inverter INV2 at the "L" level is transferred to the node N10. Additionally, the voltage VRDEC is equal to Vdd. Hence, the MOS transistor HND1 is cut off.

Thereafter, at time t1, the signal BSTON is set to the "L" level. At time t2, VRDEC is set equal to VPGMH. However, the node N10 remains at the "L" level. Hence, the MOS transistor HND 1 remains in the cutoff state.

In the above-described operation, after time t2, VPGMH is applied to the drain of the MOS transistor HND1. The voltage of the source of the MOS transistor HND1 is between about 0 V and about Vdd. Thus, since the MOS transistor HND1 has a high breakdown-voltage on the drain side, the impurity diffusion layer 27 is desirably formed on the drain side. The above-described situation also occurs during data read.

Figure 27B:
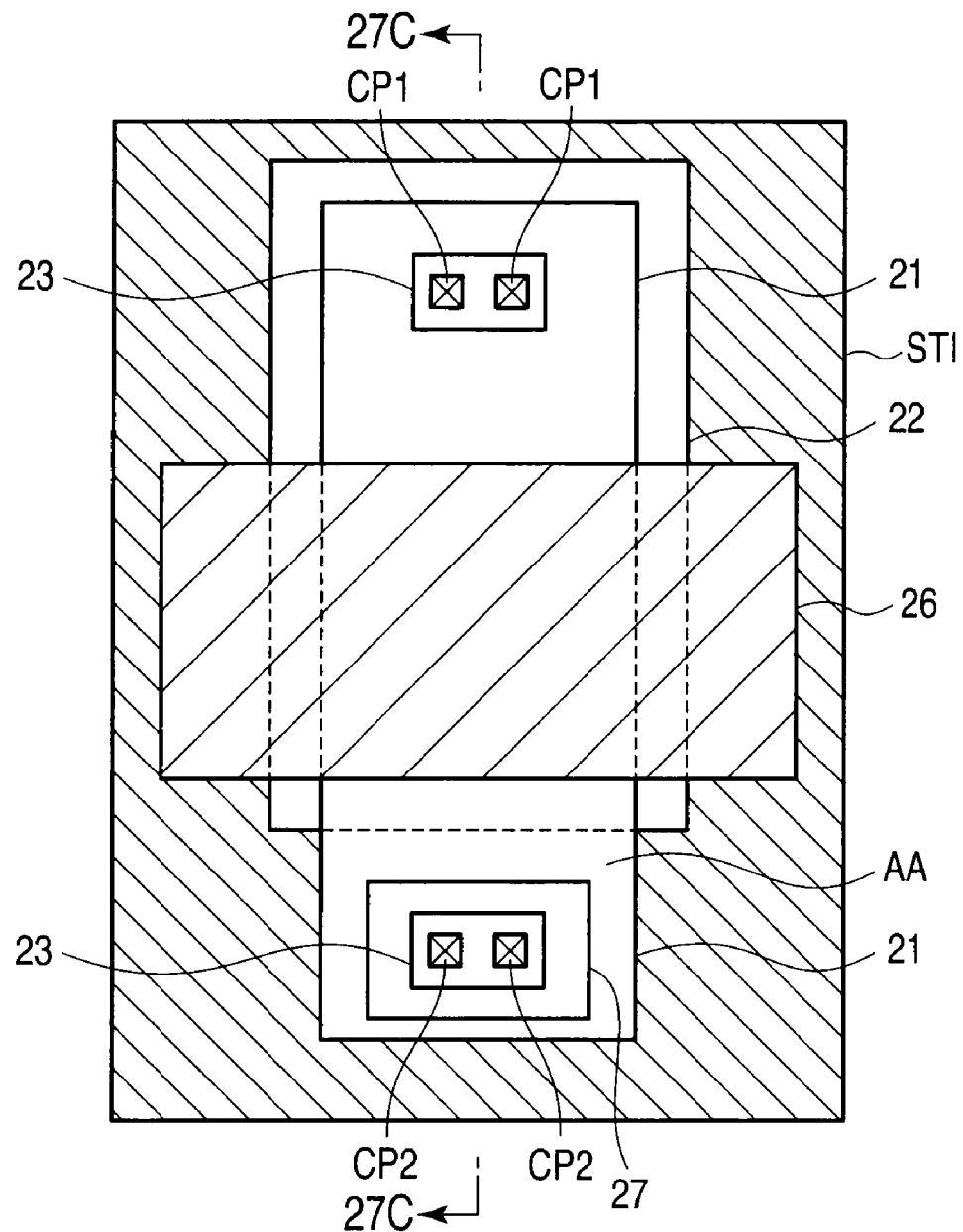
FIG. 27B is a plan view of the D-type MOS transistor according to a modification of the third embodiment.

In FIG. 27B and 27C, a modification of the memory device according to the third embodiment of the present invention will be shown. FIG. 27B is a plan view of a first MOS transistor according to the modification of the present embodiment. FIG. 27C is a sectional view taken along line 27C-27C in FIG. 27B.

As shown in FIG. 27B and FIG. 27C, the overlapping region 24 of the source region is omitted and the channel region 22 is formed all over the element region AA of the source diffusion region 21 in the structure shown in FIG. 25 and FIG. 26. As a result, the first MOS transistor of the modification can flow a large current when the first MOS transistor of the modification turns on compared with the first MOS transistor of the present embodiment.

[Fourth Embodiment]

Now, a semiconductor memory device according to a fourth embodiment of the present invention will be described. The present embodiment relates to the E-type n-channel MOS transistors QN0 to QN10 included in the NAND flash memory described in the first to third embodiments. Only differences from the first to third embodiments will be described. An E-type MOS transistor used for the MOS transistors QN0 to QN10 is hereinafter referred to as a third MOS transistor. A high breakdown-voltage E-type MOS transistor corresponding to a comparative example is hereinafter referred to as a fourth MOS transistor.

<Planar and Sectional Configurations>

FIG. 28A is a plan view of the third MOS transistors QN0 to QN10 according to the present embodiment. FIG. 28B is a plan view of the fourth MOS transistor corresponding to the comparative example. FIG. 29A and FIG. 29B are sectional views taken along line 29A-29A in FIG. 28A and line 29B-29B in FIG. 28B, respectively.

As shown in FIG. 28A and FIG. 28B, the third MOS transistor corresponds to the configuration in FIG. 8 and FIG. 9 described in the first embodiment in which the channel region 22 has a p-conductivity type. The third MOS transistor is formed of p-type impurities such as boron (B). Moreover, the overlapping region 24 is formed by superimposing the source/drain diffusion region 21 on the p-type channel region 22. Thus, the overlapping region 24 according to the present embodiment contains the p-type impurities such as boron and n-type impurities from the source/drain diffusion region 21 such as phosphorous (P). The n-type impurity concentration of the overlapping region 24 is relatively lower than that of the overlapping region 24 according to the first embodiment. Furthermore, the impurity diffusion layer 27 is formed of n-type impurities such as arsenic (As) and/or phosphorous (P). The channel region and overlapping region according to the present embodiment are hereinafter referred to as the channel region 40 and the overlapping region 41, respectively, in order to distinguish the present embodiment from the first to third embodiments. The remaining part of the configuration of the present embodiment is similar to that of the first embodiment. On the other hand, the fourth MOS transistor does not include the impurity diffusion layer 27 compared to the third MOS transistor. The remaining part of the configuration of the fourth MOS transistor is similar to that of the third MOS transistor. The gate insulating film, gate electrode, source/drain diffusion region, and contact region in the fourth MOS transistor are hereinafter referred to as the gate insulating film 35, the gate electrode 36, the source/drain diffusion region 31, and the contact region 33, respectively.

<Impurity Concentration Distribution>

Now, the impurity concentration distribution of the third MOS transistor will be described. FIG. 30A is a graph showing the distribution, along the channel length direction (in which the source, the channel, and the drain are sequentially arranged), of the maximum values (peak concentrations) of the impurity concentration D in the regions 40, 41, 21, 23, and 27 of the third MOS transistors QN0 to QN10 according to the present embodiment shown in FIG. 28A and FIG. 29A. At an alternate long and short dash line corresponding to a boundary, the conductivity type of the impurities changes between the n-type and the p-type. A distribution shown by a dashed line in FIG. 30A is the concentration distribution according to the first embodiment and is illustrated as a reference for comparison with the present embodiment.

As shown in FIG. 30A, the impurity concentration distribution according to the present embodiment corresponds to the distribution described in the first embodiment and involving the channel region 40 formed of p-type impurities. Thus, contrary to the distribution in FIG. 12 described in the first embodiment, the n-type impurity concentration is lower in the overlapping region 41 than in the source/drain diffusion region 21. The remaining part of the configuration of the present embodiment is similar to that of the first embodiment. That is, the presence of the impurity diffusion layer 27 makes the impurity concentration higher around the periphery of the contact region 23 than in the source/drain diffusion region 21.

The impurity concentration distribution of the above-described fourth MOS transistor will be described. FIG. 30B is a graph showing the distribution, along the channel length direction (in which the source, the channel, and the drain are sequentially arranged), of the maximum values (peak concentrations) of the impurity concentration D in the regions 40, 41, 31, and 33 of the fourth MOS transistor according to the comparative example shown in FIG. 28B and FIG. 29B. At an alternate long and short dash line corresponding to a boundary, the conductivity type of the impurities changes between the n-type and the p-type. A distribution shown by a dashed line in FIG. 30B is the concentration distribution according to the first embodiment and is illustrated as reference for comparison with the present embodiment.

As shown in FIG. 30B, the impurity concentration distribution according to the comparative example lacks the impurity diffusion layer 27 compared to the impurity concentration distribution according to the present embodiment. As a result, the impurity concentration distribution according to the comparative example is such that the impurity concentration is lower around the periphery of the contact region 33, compared to that according to the present embodiment.

Furthermore, the impurity concentration distribution according to the present embodiment is such that the gradient of a variation in the impurity concentration from the contact region 23 through the source/drain diffusion region 21 is gentler than in the comparative example.

FIG. 31A is a graph showing the distribution, along the channel length direction, of the concentrations of phosphorous (P), arsenic (As), and boron (B) in the regions 40, 41, 21, 23, and 27 of the third MOS transistors QN0 to QN10 according to the present embodiment shown in FIG. 28A and FIG. 29A. FIG. 31A shows that the impurity diffusion layer 27 is formed using arsenic (As).

FIG. 31A is different from FIG. 14 described in the first embodiment in that the channel region 40 is formed of p-type impurities. The impurity diffusion layer 27 may be formed of phosphorous (P) instead of arsenic (As) or formed of both phosphorous and arsenic.

FIG. 31B is a graph showing the distribution, along the channel length direction, of the concentrations of phosphorous (P), arsenic (As), and boron (B) in the regions 40, 41, 31, and 33 of the fourth MOS transistors QN0 to QN10 according to the present embodiment shown in FIG. 28B and FIG. 29B. FIG. 31B is different from FIG. 31A described in the present embodiment in that the impurity diffusion layer 27 is not formed. In other respects, the impurity concentration distribution in FIG. 31B is the same as that in FIG. 31A.

<Manufacturing Method>

Now, a manufacturing method for the above-described third MOS transistor will be described with reference to FIG. 32 to FIG. 35. FIG. 32 to FIG. 35 are sectional views sequentially showing the manufacturing steps for the third MOS transistor. FIG. 32 to FIG. 35 also show manufacturing steps for the fourth MOS transistor corresponding to the comparative example. The third MOS transistor is shown on the left of each drawing. The fourth MOS transistor is different from the third MOS transistor in that the fourth MOS transistor does not include the impurity diffusion layer 27.

Figure 32:
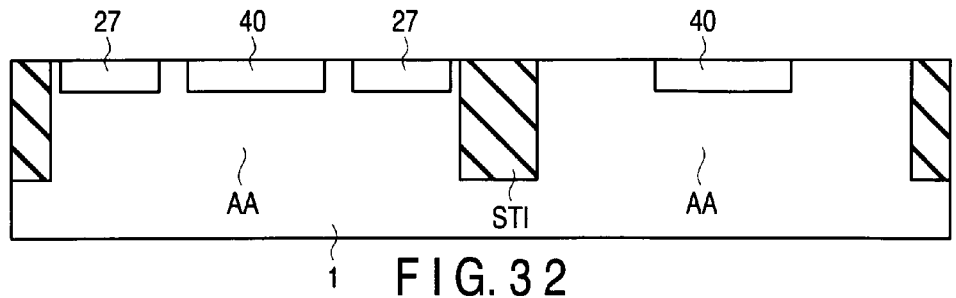
FIG. 32 to FIG. 35 are sectional views sequentially showing the first to fourth manufacturing steps for the E-type MOS transistors according to the fourth embodiment and the comparative example.

As shown in FIG. 32, an isolation insulating film STI is formed in the semiconductor substrate 1. Then, for example, channel implantation is performed using boron (B) as an impurity to form a channel region 40. Furthermore, channel implantation is performed using arsenic (As) and/or phosphorous (P) as impurities to form an impurity diffusion layer 27. Using, for example, the photolithography technique and a photoresist as a mask, the channel region 40 is formed close to a region immediately below the region in which a gate electrode 26 is to be subsequently formed. Similarly, the impurity diffusion layer 27 is formed in a region including the region in which a contact region 23 is to be subsequently formed.

In order to allow the steps to be simplified, the impurity diffusion layer 27 may be formed simultaneously with formation of the channel regions 22 and 32 and impurity diffusion layer 27 of the first and second MOS transistors shown in FIG. 16. As a result, the channel regions 22 and 32 of the first and second MOS transistors and the impurity diffusion layer 27 of each of the first and third MOS transistors have almost the same impurity concentration.

In order to allow the steps to be simplified, the channel regions 40 of the third and fourth MOS transistors may be formed during the same step. As a result, the channel regions 40 of the third and fourth transistors have almost the same impurity concentration.

Figure 33:
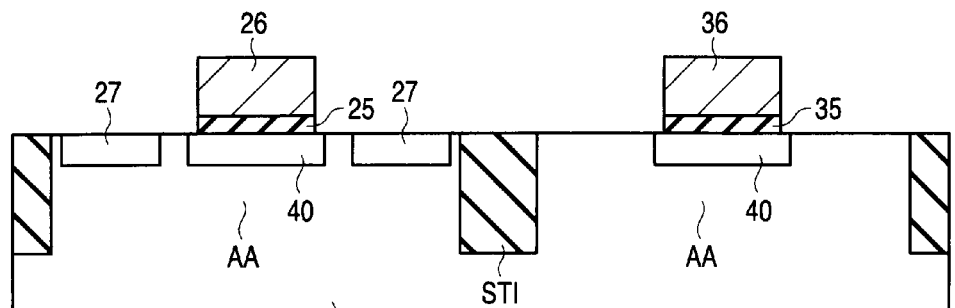

As shown in FIG. 33, gate electrodes 26 and 36 are formed with the gate insulating films 25 and 35 interposed therebetween, respectively. The gate electrode 26 belongs to the third MOS transistor. The gate electrode 36 belongs to the fourth MOS transistor. The gate electrodes 26 and 36 of the third and fourth MOS transistors may be manufactured during the same step in which the gate electrodes 26 and 36 of the first and second MOS transistors are manufactured.

Figure 34:
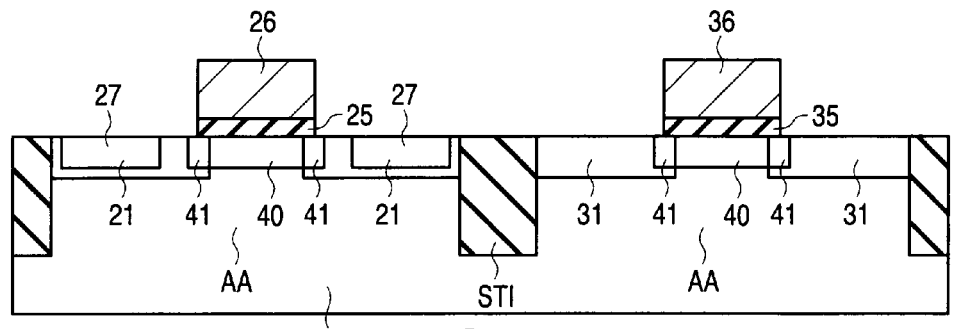

As shown in FIG. 34, ion implantation with phosphorous (P) as an impurity is performed in a self-aligned manner through the gate electrodes 26 and 36 as masks. Source/drain diffusion regions 21 and 31 are thus formed. The source/drain diffusion region 21 in combination with the impurity diffusion layer 27 functions as the source and drain of the third MOS transistor. The source/drain diffusion region 31 functions as the source and drain of the fourth MOS transistor. In this case, the channel region 40 is formed only in the vicinity of the region immediately below the gate electrode 26. Thus, the overlapping region 41 is formed immediately below the end surface of each of the gate electrodes 26 and 36 where the channel region 40 and the corresponding one of the source/drain diffusion regions 21 and 31 overlap. Furthermore, the source/drain diffusion regions 21 and 31 are formed so as to surround the periphery of the impurity diffusion layer 27. Thus, the impurity concentration in the impurity diffusion layer 27 is the sum of the ion implantation concentration in FIG. 33 and the ion implantation concentration in the present step.

Of course, the source/drain diffusion regions 21 and 31 may be formed during the same step. In this case, the source/drain diffusion regions 21 and 31 of the third and fourth transistors have almost the same impurity concentration. Furthermore, the overlapping regions 41 of the third and fourth MOS transistors have an equal impurity concentration. Moreover, the source/drain diffusion regions 21 and 31 of the third and fourth MOS transistors may be manufactured during the same step in which the source/drain diffusion regions 21 and 31 of the first and second MOS transistors are manufactured.

Figure 35:
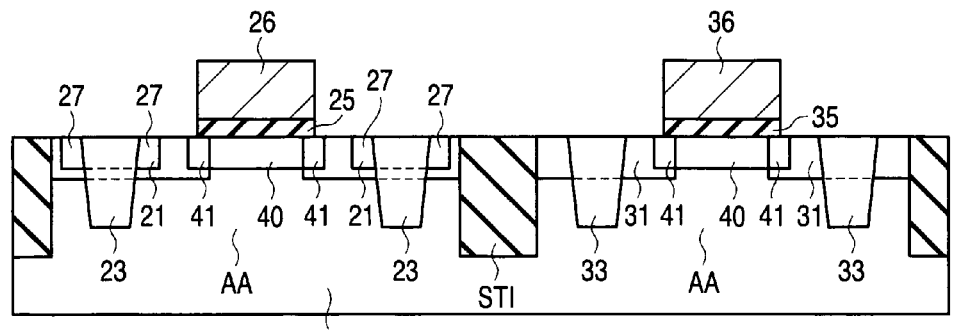

As shown in FIG. 35, for example, arsenic (As) is further ion-implanted into a part of each of the source/drain diffusion regions 21 and 31 to form a contact region 23 or 33, respectively. The contact region 23 is for the third MOS transistor. The contact region 33 is for the fourth MOS transistor. The contact region 23 is formed so as to penetrate the impurity diffusion layer 27 and the source/drain diffusion region 21. As a result, the third and fourth MOS transistors are completed.

In case the channel regions 40 and source/drain diffusion regions 21 and 31 of the third and fourth transistors are simultaneously formed, the third and fourth transistors with different breakdown-voltage characteristics can be simultaneously formed on the semiconductor substrate without an increase in the number of required steps.

<Effects>

As described above, in the semiconductor memory device according to the present embodiment, the junction breakdown-voltage even of the E-type MOS transistor can be improved as described in the first embodiment.

Figure 36:
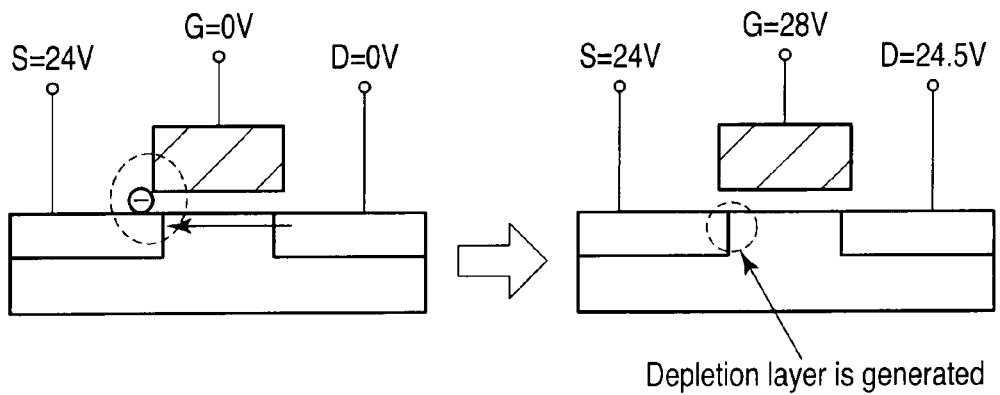
FIG. 36 is a sectional view of the E-type MOS transistor.

Furthermore, the present embodiment enables a reduction in the adverse effect of a variation in threshold caused by offleakage from the MOS transistor. This will be described below. FIG. 36 is a sectional view of the MOS transistor showing that the MOS transistor has been switched from the cutoff state (left side of the figure) to the on state (right side of the figure).

It is assumed that the MOS transistor is cut off, by for example, applying 0 V to a gate G, applying 24 V to a source C, and applying 0 V to a drain D as shown on the left side of FIG. 36. Even in this case, a leakage current flows between the source and the drain. As a result, the high electric field between the source S and the gate electrode may cause electrons resulting from the leakage current to be trapped in a portion (region shown by a dashed line in FIG. 36) of the gate insulating film located close to the source S. The trapping of electrons in the gate insulating film is equivalent to the application of a negative voltage to the gate electrode. This increases the threshold voltage of the MOS transistor. In other words, a channel is unlikely to be formed near the source S.

It is assumed that in this state, 24 V, 28 V, and 24.5 V are applied to the source S, the gate G, and the drain D as shown on the right side of FIG. 36. Then, a channel is formed between the source S and the drain D to turn on the MOS transistor. However, if in the above-described cutoff state, electrons are trapped in the gate insulating film, a channel is unlikely to be formed compared to the case in which no electron is trapped in the gate insulating film.

Figure 37:
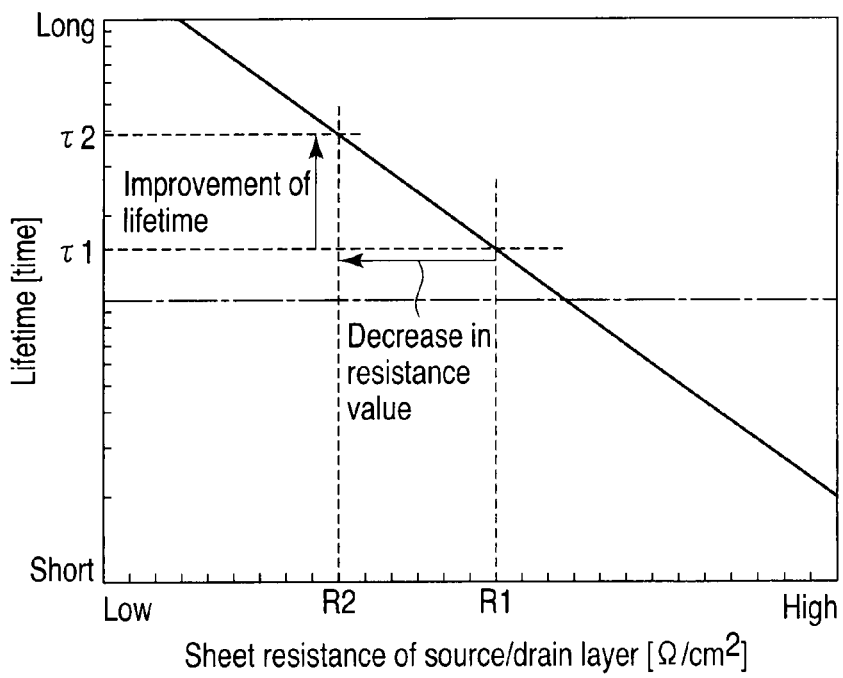
FIG. 37 is a graph showing the resistance-lifetime characteristics of the E-type MOS transistor according to the fourth embodiment.

The present inventors have found that the increase in the threshold voltage of the MOS transistor caused by the electrons trapped in the gate insulating film depends on the resistance value of the source/drain diffusion region 21 (the resistance value of the region between the overlapping region 41 and the contact region 23). This relationship is shown in FIG. 37. FIG. 37 shows the relationship between the sheet resistance of the source/drain diffusion region 21 and the lifetime of the MOS transistor. The axis of abscissa is shown on a linear scale, and the axis of ordinate is shown on the log scale. The "lifetime" as used herein means the smaller of the time period required to reduce a current (hereinafter referred to as a "drain current") flowing through the drain D of the MOS transistor down to at most a given value, and the time period required to increase the threshold voltage of the MOS transistor by at least a given value, when stress is applied to the MOS transistor for a predetermined time (this time is referred to as the "stress time"). The stress in FIG. 37 means, for example, such a cutoff state as shown in the left figure of FIG. 36. As shown in the figure, the lifetime varies linearly on a single-logarithm graph with respect to the resistance value. That is, the lifetime increases with decreasing resistance value.

In contrast, in the configuration according to the present embodiment, the impurity diffusion layer 27 having a higher impurity concentration than the source/drain diffusion region 21 is provided in the source/drain diffusion region 21. This reduces the resistance value of the source and drain. That is, as shown in the graph in FIG. 37, the provision of the impurity diffusion layer 27 is effective for reducing the resistance value from R1 to R2. This enables the lifetime of the MOS transistor to be increased from τ1 to τ2.

<Modification>

FIG. 38 is a sectional view of the third MOS transistor according to a modification of the present embodiment. As shown in the figure, the impurity diffusion layer 27 in the source/drain diffusion region 21 may be formed in contact with the overlapping region 41. In the present configuration, the n-type impurity concentration in the region between the overlapping region 41 and the contact region 23 can be set higher than in the configuration shown in FIG. 29. Thus, the lifetime can be improved.

In connection with the improvement of the lifetime, the impurity diffusion layer 27 is located as close to the overlapping region 41 as possible and preferably contacted with the overlapping region, for example, as shown in FIG. 38. In this case, to prevent a possible decrease in surface breakdown-voltage, the impurity concentration in the overlapping region 41 is preferably inhibited from being increased by allowing the impurity diffusion layer 27 to overlap the overlapping region 41.

[Fifth Embodiment]

Now, a semiconductor memory device according to a fifth embodiment of the present invention will be described. The present embodiment corresponds to the fourth embodiment to which the configuration described above in the second embodiment is applied. That is, the present embodiment corresponds to the configuration in FIG. 29 described in the fourth embodiment in which the impurity diffusion layer 27 is set deeper than the contact region 23. Only differences from the fourth embodiment will be described below.

FIG. 39 is a sectional view of the third MOS transistor according to the present embodiment. As shown in the figure, the configuration according to the present embodiment corresponds to the configuration in FIG. 29 described in the fourth embodiment and in which the impurity diffusion layer 27 is formed to be deeper than the contact region 23. In other words, the impurity diffusion layer 27 surrounds the periphery of the contact region 23 not only in the in-plane direction of the semiconductor substrate 1 but also in the depth direction of the semiconductor substrate 1. In other words, inside the semiconductor substrate 1, the impurity diffusion layer 27 surrounds the entire periphery of the contact region 23.

The present configuration can be formed by the method described in the second embodiment.

Thus, the second embodiment can be applied to the E-type MOS transistor to exert effects similar to those described above. The present configuration can also be applied to the configuration shown in FIG. 38.

As described above, the semiconductor memory device according to the first to third embodiments includes a peripheral circuit which drives the memory cell transistor Mi capable of storing data, the peripheral circuit including the depletion-type first MOS transistor. The first MOS transistor includes the gate electrode 26, the channel region 22 of a first conductivity type, the source region 21 and drain region 21 of the first conductivity type, the overlapping region 24 of the first conductivity type, the contact region 23 of the first conductivity type, and the impurity diffusion layer 27 of the first conductivity type. The channel region 22 is formed in the surface of the semiconductor layer 1 close to a region immediately below the gate electrode 26. The channel region 22 has a first impurity concentration. Each of the source region 21 and the drain region 21 is formed in the surface of the semiconductor layer 1 in a self-aligned manner with respect to the gate electrode 26. Each of the source region 21 and the drain region 21 has a second impurity concentration higher than the first impurity concentration. The overlapping region 24 is formed in the surface of the semiconductor layer 1 immediately below the gate electrode 26 where the channel region 22 overlaps the source region 21 and the drain region 21. The overlapping region 24 has a third impurity concentration higher than the second impurity concentration. The contact region 23 is formed in at least a part of the surface of each of the source region 21 and the drain region 21. The contact region 23 has a fourth impurity concentration higher than the second impurity concentration. The impurity diffusion layer 27 is formed in a partial region of at least one of the source region 21 and the drain region 21. The impurity diffusion layer 27 has a fifth impurity concentration higher than the second impurity concentration and lower than the fourth impurity concentration. The impurity diffusion layer 27 is formed in contact with the contact region 23 and away from the overlapping region 24. The impurity diffusion layer 27 is positioned at least in the region between the contact region 23 and the overlapping region 24.

The above-described configuration enables the breakdown-voltage of the D-type MOS transistor to be improved, allowing the operational reliability of the semiconductor memory device to be improved.

Furthermore, in the semiconductor memory device according to the fourth and fifth embodiments, the peripheral circuit includes an enhancement-type second MOS transistor (each of the third MOS transistors QN0 to QN10 in the embodiments). Each of the second transistors QN0 to QN10 includes the source region 21 and drain region 21 of the first conductivity type, the contact region 23 of the first conductivity type, and the impurity diffusion layer 27 of the first conductivity type. The source region 21 and the drain region 21 are formed on the surface of the semiconductor layer 1 in a self-aligned manner with respect to the gate electrode 26. Each of the source region 21 and the drain region 21 has a sixth impurity concentration. The contact region 23 is formed in at least a part of the surface of each of the source region 21 and the drain region 21. The contact region 23 has a seventh impurity concentration higher than the sixth concentration. The impurity diffusion layer 27 is formed in a partial region of each of the source region 21 and the drain region 21. The impurity diffusion layer 27 has an eighth impurity concentration higher than the sixth impurity concentration and lower than the seventh impurity concentration. The impurity diffusion layer 27 of each of the second transistors QN0 to QN10 contacts the contact region 23 and is positioned at least in the region between the contact region 23 and the region located immediately below the gate electrode 26. The present configuration may further includes the channel region 40 of the second conductivity type that is opposite to the first conductivity type, and the overlapping region 41 formed by the overlapping between the channel region 40 and each of the source region 21 and the drain region 21.

The above-described configuration enables the breakdown-voltage of the E-type MOS transistor to be improved, allowing the operational reliability of the semiconductor memory device to be improved.

In the above-described embodiments, examples of the first MOS transistor including the impurity diffusion layer 27 are the MOS transistors HND1 and HND2 in the voltage switching circuit 54A included in the row decoder 105. However, the configuration of the first MOS transistor is applicable not only to the MOS transistors HND1 and HND2 but also to MOS transistors in other peripheral circuits. This also applies to the third MOS transistor. The configuration of the third MOS transistor is applicable not only to the MOS transistors QN0 to QN10 but also to other MOS transistors. Furthermore, the fourth MOS transistor is applicable to a logic circuit such as the column decoder 103 or the address buffer 104. For example, the fourth MOS transistor is excellent in surface breakdown-voltage and thus applicable to circuit elements in a portion to which a high voltage is applied. Additionally, the fourth MOS transistor can be formed simultaneously with the formation of the first to third MOS transistors. This prevents an increase in the number of manufacturing steps.

Furthermore, the above-described third embodiment can be combined with the second embodiment. That is, in the configuration shown in FIG. 24, the impurity diffusion layer 27 may be formed exclusively on one of the source side and the drain side.

Moreover, in the above-described first to third embodiments, the impurities (for example, phosphorous (P)) contained in the impurity diffusion layer 27 are the same as those contained in the channel region 22. In this case, as described above, the ion implantation step for forming an impurity diffusion layer 27 can be carried out simultaneously with the ion implantation step for forming a channel region 22. However, the impurity diffusion layer 27 and the channel region 22 may be formed of different types of impurities as required. Moreover, the impurities used are not limited to arsenic (As) and phosphorous (P) but may be appropriately selected as required.

Furthermore, the impurity concentration for the ion implantation may vary between the formation region for the impurity diffusion layer 27 and the formation region for the channel region 22. The impurity concentration in the completed impurity diffusion layer 27 may be the same as or different from that in the completed channel region 22. It is sufficient if the impurity concentration in the impurity diffusion layer 27 is lower than that in the contact region 23 and the source/drain diffusion region 21.

Moreover, in the above-described embodiments, for example, as shown in FIG. 8 and FIG. 9, the impurity diffusion layer 27 is formed to surround the side surface of the contact region 23. However, for example, the impurity diffusion layer 27 may be formed at least in the region between the contact region 23 and the overlapping region 24 and prevented from being formed in the region between the contact region 23 and the isolation region STI. This also applies to the third MOS transistor.

Figure 40:
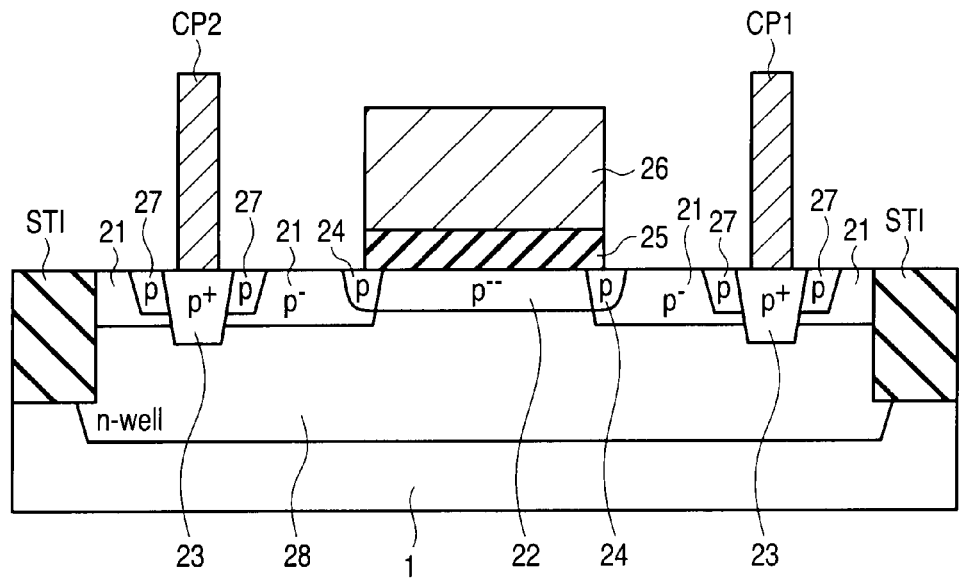
FIG. 40 and FIG. 41 are sectional views showing the configurations of D-type MOS transistors according to a first modification and a second modification, respectively, of the first to third embodiments.

Furthermore, in the above-described embodiments, the first and third MOS transistors including the impurity diffusion layer 27 are n-channel MOS transistors. However, the first and third MOS transistors may be p-channel MOS transistors as required. A sectional view of the first MOS transistor in this case is shown in FIG. 40. As shown in the figure, the n-type well region 28 is formed in the surface region of the semiconductor substrate 1. The first MOS transistor is formed on the well region 28. The basic configuration of the first MOS transistor is as described in the first to third embodiments. However, the regions 22 to 24 and 27 are formed of a p-type impurity diffusion layer. The magnitude relationship among the impurity concentrations in the regions 22 to 24 and 27 is similar to that in the first embodiment. For the third MOS transistor, the following configuration is possible. In FIG. 29, FIG. 38, or FIG. 39, an n-type well region is formed in the surface region of the semiconductor layer 1, the region 40 is formed into the n-type, and the regions 21, 23, 27, and 41 are formed into the p-type.

Figure 41:
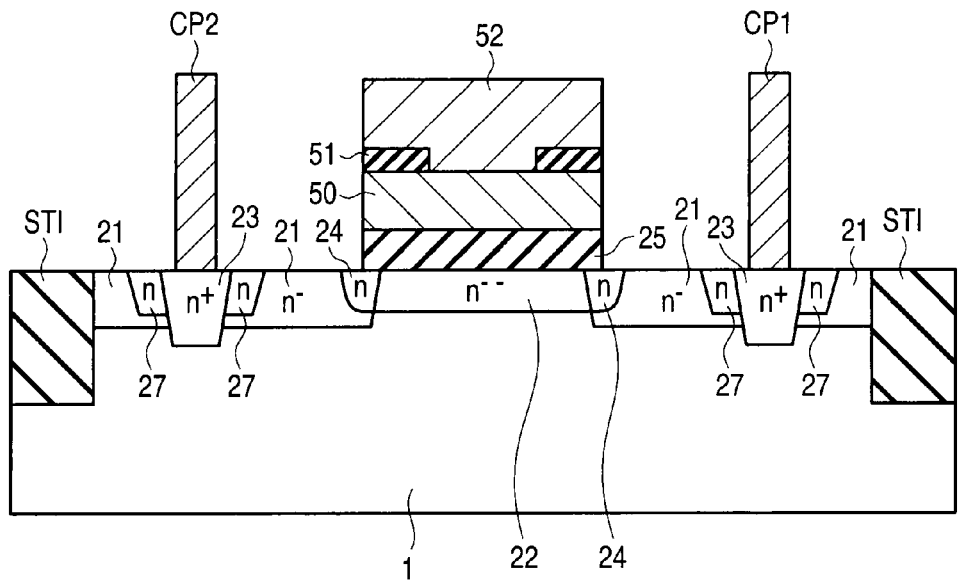

Additionally, the gate electrodes 26 and 36 of the first to fourth MOS transistors may have a stack gate structure like the select transistors S1 and S2. A sectional view of the first MOS transistor with such a configuration is shown in FIG. 41. As shown in the figure, the gate structure 26 has a stack gate structure including a polycrystalline silicon layer 50 formed on the gate insulating film 25 and a polycrystalline silicon layer 52 formed on the polycrystalline silicon layer 50 with an inter-gate insulating film 51 interposed therebetween. A part of the inter-gate insulating film 51 is removed. The polycrystalline silicon layers 50 and 52 are connected together through the removed region. According to the present configuration, the gate electrodes of the first to fourth MOS transistors can be formed during the same step in which the gate electrodes of the memory cell Mi and select transistors S1 and S2 are formed.

Furthermore, the first to fourth embodiments are applicable to I-type MOS transistors. In this case, the channel regions 22 and 40 are unnecessary. Thus, the overlapping regions 24 and 41 are not formed. The I-type MOS transistor may be included in the NAND flash memory.

In the above-described embodiments, the NAND flash memory has been taken as an example. However, the embodiments are applicable not only to the NAND flash memory but also to other EEPROMs such as a NOR flash memory and semiconductor memory devices in general including a high breakdown-voltage MOS transistor. Additionally, the embodiments are applicable not only to the semiconductor memory device but also to a wide variety of common semiconductor integrated circuits.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array including a memory cell transistor with a charge layer formed on a semiconductor layer with a gate insulating film interposed therebetween; and
   a peripheral circuit including at least a first transistor,
   wherein the first transistor includes:
   a first gate electrode disposed on a surface of the semiconductor layer with a first gate insulating film interposed therebetween;
   a first channel region of a first conductivity type formed in the surface of the semiconductor layer close to a region located immediately below the first gate electrode, the first channel region having a first impurity concentration;
   a first source region of the first conductivity type and a first drain region of the first conductivity type each formed in the surface of the semiconductor layer and each having a second impurity concentration higher than the first impurity concentration;
   a first overlapping region of the first conductivity type formed in the surface of the semiconductor layer immediately below the first gate electrode where the first channel region overlaps the first source region and the first drain region, the first overlapping region having a third impurity concentration higher than the second impurity concentration;
   a first contact region of the first conductivity type formed in at least a part of a surface of each of the first source region and the first drain region and having a fourth impurity concentration higher than the second impurity concentration; and
   a first impurity diffusion region of the first conductivity type formed in a partial region of at least one of the first source region and the first drain region and having a fifth impurity concentration higher than the second impurity concentration and lower than the fourth impurity concentration, and
   the first impurity diffusion region is formed in contact with the first contact region and away from the first overlapping region and positioned at least in a region between the first contact region and the first overlapping region.

2. The device according to claim 1, wherein the peripheral circuit further includes a second transistor, and
   the second transistor includes:
   a second gate electrode disposed on the surface of the semiconductor layer with a second gate insulating film interposed therebetween;
   a second channel region of the first conductivity type formed in a portion of the surface of the semiconductor layer which includes the region located immediately below the second gate electrode, the second channel region having a sixth impurity concentration; and
   a second source region of the first conductivity type and a second drain region of the first conductivity type each formed in the surface of the semiconductor layer and each having a seventh impurity concentration higher than the sixth impurity concentration.

3. The device according to claim 2, wherein the first impurity concentration is equal to the sixth impurity concentration, and
   the third impurity concentration is equal to the seventh impurity concentration.

4. The device according to claim 1, wherein an impurity implanted into the first channel region is different from that into the first source region and the first drain region, and
   is of the same as that into the first impurity diffusion region.

5. The device according to claim 1, wherein the first impurity diffusion region is formed in both of the first source region and the first drain region.

6. The device according to claim 1, wherein the first impurity diffusion region covers a side surface and a bottom surface of the first contact region.

7. The device according to claim 1, wherein the peripheral circuit further includes a second transistor,
   the second transistor includes:
   a second gate electrode disposed on the surface of the semiconductor layer with a second gate insulating film interposed therebetween;
   a second source region of the first conductivity type and a second drain region of the first conductivity type each formed in the surface of the semiconductor layer and each having a sixth impurity concentration;
   a second contact region of the first conductivity type formed in at least a part of a surface of each of the second source region and the second drain region and having a seventh impurity concentration higher than the sixth impurity concentration; and
   a second impurity diffusion region of the first conductivity type formed in a partial region of each of the second source region and the second drain region and having an eighth impurity concentration higher than the sixth impurity concentration and lower than the seventh impurity concentration, and
   the second impurity diffusion region is formed in contact with the second contact region and positioned at least in a region between the second contact region and the second gate electrode.

8. The device according to claim 7, wherein the second transistor further includes:
   a second channel region of a second conductivity type opposite to the first conductivity type, the second channel region being formed in the surface of the semiconductor layer close to the region located immediately below the second gate electrode, the second channel region having a ninth impurity concentration; and
   a first overlapping region of the first conductivity type formed in the surface of the semiconductor layer immediately below the second gate electrode where the second channel region overlaps the second source region and the second drain region, the first overlapping region having a higher resistivity than the second source region and the second drain region.

9. The device according to claim 8, wherein the second impurity diffusion region contacts the overlapping region.

10. The device according to claim 7, wherein the second impurity diffusion region covers a side surface and a bottom surface of the second contact region.

11. A depletion MOS transistor comprising:
a gate electrode disposed on a surface of a semiconductor layer with a gate insulating film interposed therebetween;
a channel region of a first conductivity type formed in the surface of the semiconductor layer close to a region located immediately below the gate electrode, the channel region having a first impurity concentration;
a source region of the first conductivity type and a drain region of the first conductivity type each formed in the surface of the semiconductor layer and each having a second impurity concentration higher than the first impurity concentration;
an overlapping region of the first conductivity type formed in the surface of the semiconductor layer immediately below the gate electrode where the channel region overlaps the source region and the drain region, the overlapping region having a third impurity concentration higher than the second impurity concentration;
a contact region of the first conductivity type formed in at least a part of a surface of each of the source region and the drain region and having a fourth impurity concentration higher than the second impurity concentration; and
an impurity diffusion region of the first conductivity type formed in a partial region of at least one of the source region and the drain region and having a fifth impurity concentration higher than the second impurity concentration and lower than the fourth impurity concentration,
wherein the impurity diffusion region is formed in contact with the contact region and away from the overlapping region and positioned at least in a region between the contact region and the overlapping region.

12. The transistor according to claim 11, wherein an impurity implanted into the channel region is different from that into the source region and the drain region, and
is of the same as that into the impurity diffusion region.

13. The transistor according to claim 11, wherein the impurity diffusion region is formed in both of the source region and the drain region.

14. The transistor according to claim 11, wherein the impurity diffusion region covers a side surface and a bottom surface of the contact region.

* * * * *